United States Patent
Mirkin et al.

(10) Patent No.: US 7,569,252 B2
(45) Date of Patent: *Aug. 4, 2009

(54) METHODS UTILIZING SCANNING PROBE MICROSCOPE TIPS AND PRODUCTS THEREFOR OR PRODUCED THEREBY

(75) Inventors: Chad A. Mirkin, Wilmette, IL (US); Richard Piner, St. Louis, MO (US); Seunghun Hong, Chicago, IL (US)

(73) Assignee: Northwestern University, Evanston, IL (US)

( * ) Notice: Subject to any disclaimer, the term of this patent is extended or adjusted under 35 U.S.C. 154(b) by 663 days.

This patent is subject to a terminal disclaimer.

(21) Appl. No.: 10/449,685

(22) Filed: Jun. 2, 2003

(65) Prior Publication Data

US 2004/0028814 A1    Feb. 12, 2004

Related U.S. Application Data

(63) Continuation of application No. 09/477,997, filed on Jan. 5, 2000, now Pat. No. 6,635,311.

(60) Provisional application No. 60/115,133, filed on Jan. 7, 1999, provisional application No. 60/157,633, filed on Oct. 4, 1999.

(51) Int. Cl.
B05D 5/00 (2006.01)

(52) U.S. Cl. .................. 427/256; 427/261; 427/265; 427/287; 977/840; 977/863

(58) Field of Classification Search .................. 427/256, 427/261, 265, 287
See application file for complete search history.

(56) References Cited

U.S. PATENT DOCUMENTS

| | | | |
|---|---|---|---|
| 4,479,831 A | 10/1984 | Sandow et al. |
| 5,138,174 A | 8/1992 | Tang |
| 5,221,415 A | 6/1993 | Albrecht et al. |
| 5,227,626 A | 7/1993 | Okada et al. |
| 5,252,835 A | 10/1993 | Lieber et al. |
| 5,254,854 A | 10/1993 | Betzig |
| 5,345,815 A | 9/1994 | Albrecht et al. |
| 5,354,985 A | 10/1994 | Quate |
| 5,363,697 A | 11/1994 | Nakagawa |
| 5,372,930 A | 12/1994 | Colton et al. |
| 5,472,881 A | 12/1995 | Beebe et al. |
| 5,517,280 A | 5/1996 | Quate |
| RE35,317 E | 8/1996 | Lindsay |
| 5,618,760 A | 4/1997 | Soh et al. |
| 5,630,932 A | 5/1997 | Lindsay et al. |
| 5,666,190 A | 9/1997 | Quate et al. |
| 5,742,377 A | 4/1998 | Minne et al. |
| 5,747,334 A | 5/1998 | Kay et al. |
| 5,776,748 A | 7/1998 | Singhvi et al. |
| 5,874,668 A | 2/1999 | Xu et al. |
| 5,922,214 A | 7/1999 | Liu et al. |
| 5,962,736 A | 10/1999 | Zambias et al. |
| 5,985,356 A | 11/1999 | Schultz et al. |
| 6,034,348 A | 3/2000 | Kim et al. |
| 6,181,097 B1 | 1/2001 | Li et al. |
| 6,262,426 B1 | 7/2001 | Zafiratosz |
| 6,270,946 B1 | 8/2001 | Miller |
| 6,353,219 B1 | 3/2002 | Kley |
| 2001/0044106 A1 | 11/2001 | Henderson et al. |
| 2001/0051337 A1 | 12/2001 | Henderson et al. |
| 2002/0063212 A1 | 5/2002 | Mirkin et al. |
| 2002/0076927 A1 | 6/2002 | Henderson et al. |

FOREIGN PATENT DOCUMENTS

| | | |
|---|---|---|
| EP | 0 450 771 | 10/1991 |
| EP | 0 727 639 | 8/1996 |
| WO | WO 96/31625 | 10/1996 |
| WO | WO 99/31267 | 6/1999 |
| WO | WO 00/04382 | 1/2000 |
| WO | WO 00/04389 | 1/2000 |
| WO | WO 00/04390 | 1/2000 |
| WO | WO 00/36136 | 6/2000 |
| WO | WO 00/41213 | 7/2000 |
| WO | WO 00/46406 | 8/2000 |

OTHER PUBLICATIONS

Jaschke et al., "Deposition of Organic Material by the Tip of a Scanning Force Microscope," Langmuir 1995, 11, 1061-1064.*

(Continued)

*Primary Examiner*—William Phillip Fletcher, III
(74) *Attorney, Agent, or Firm*—Foley & Lardner LLP

(57) ABSTRACT

The invention provides a lithographic method referred to as "dip pen" nanolithography (DPN). DPN utilizes a scanning probe microscope (SPM) tip (e.g., an atomic force microscope (AFM) tip) as a "pen," a solid-state substrate (e.g., gold) as "paper," and molecules with a chemical affinity for the solid-state substrate as "ink." Capillary transport of molecules from the SPM tip to the solid substrate is used in DPN to directly write patterns consisting of a relatively small collection of molecules in submicrometer dimensions, making DPN useful in the fabrication of a variety of microscale and nanoscale devices. The invention also provides substrates patterned by DPN and kits for performing DPN.

The invention further provides a method of performing AFM imaging in air. The method comprises coating an AFM tip with a hydrophobic compound, the hydrophobic compound being selected so that AFM imaging performed using the coated AFM tip is improved compared to AFM imaging performed using an uncoated AFM tip. Finally, the invention provides AFM tips coated with the hydrophobic compounds.

180 Claims, 13 Drawing Sheets

OTHER PUBLICATIONS

Mamin et al., "Gold deposition from a scanning tunneling microscope tip," J. Vac. Sci. Technol. B 9 (2), Mar./Apr. 1991, 1398-1402.*

Silver et al., "Direct writing of submicron metallic features with a scanning tunneling microscope," Appl. Phys. Lett. 51 (4), Jul. 27, 1987, 247-249.*

U.S. Appl. No. 10/212,217, filed Aug. 6, 2002, Mirkin et al.

U.S. Appl. No. 10/301,843, filed Nov. 22, 2002, Mirkin et al.

Abbott, et al., Science, 257:1380-1382 (1992).

Abbott, et al., "Combining Micromachining and Molecular Self-Assembly To Fabricate Microelectrodes," *Langmuir*, 10 (8): 2672-2682 (1994), American Chemical Society, USA.

Alves, et al., "Atomic Scale Imaging of Alkanethiolate Monolayers at Gold Surfaces with Atomic Force Microscopy," *J. Am. Chem. Soc.*, 114: 1222-1227 (1992), American Chemical Society, USA.

Amro et al., *Langmuir*, 16:3006-3009 (2000).

Bain, et al., "Modeling Organic Surfaces with Self-Assembled Monolayers," *Angew. Chem. Int. Ed. Engl.*, (4): 506-512, (1989), USA.

Berggren, et al., "Microlithography by Using Neutral Metastable Atoms and Self-Assembled Monolayers," *Science*, 269: 1255-1257 (1995), USA.

Bernard et al., *Langmuir*, 14(9):2225-2229 (1998).

Binggeli, et al., "Influence of capillary condensation of water on nanotribology studied by force microscopy," *Appl. Phys. Lett*, 65, (4): 415-417 (1994), American Institute of Physics, USA.

Bishop, et al., "Self-assembled monolayers: recent developments and applications," *Science*, 1:127-136 (1996), Current Science Ltd ISSN, USA.

Bottomley, "Scanning Probe Microscopy," *Analytical Chemistry*, 70(12): 425R-475R (1998). American Chemical Society, USA.

C&EN:Letters, http://cen.acs.org/isubscribe/journals/...right.cgi?7931lett.html/?QueryZIP/mirkin, (*C&EN*, 79(31):8-11, Jul. 30, 2001).

Calvert, "Lithographic patterning of self-assembled films," *Journal of Vacuum Science & Technology B*, vol. 11, No. 6, 2155-2163 (1993).

Carr, et al., "High-Selectivity pattern transfer processes for self-assembled monolayer electron beam resists," *J. Vac. Sci. Technol. A*, 15 (3): 1446-1450 (1997), American Vacuum Society, USA.

Delamarche et al., J. Phys. Chem. B, 101:9263-9269 (1997).

Dubois, et al., "Synthesis, Structure, and Properties of Model Organic Surfaces," *Annu. Rev. Phys. Chem.* 43:437-63 (1992), Annual Reviews Inc, USA.

Feldheim, et al., "Self-assembly of single electron transistors and related devices," *Chemical Society Reviews*, 27: 1-12 (1998), Chemical Society Reviews, USA.

Foster, et al., "Molecular manipulation using a tunnelling microscope," *Nature*, 333: 324-326 (Jan. 1988), USA.

Frisbie, et al., "Functional Group Imaging by Chemical Force Microscopy," *Science*, 265: 2071-2074 (Sep. 30, 1994), USA.

Fujihira, et al., "Effect of Capillary Force on Friction Force Microscopy: A Scanning Hydrophilicity Microscope," *Chemistry Letters*, 499-500 (1996), USA.

Hamilton, New Times, http://www.newtimesslo.com/archives/index.html and http://www,newtimesslo.com/archives/cov_stories_2001/cov_08162001.html (New Times, vol. 16, No. 1, Aug. 16, 2001).

Herne et al., *J. Am. Chem. Soc.* 119:8916-8920 (1997).

Hidber et al., *Langmuir*, 12:5209-5215 (1996).

Hong et al., *Langmuir*, 15:7897-7900 (1999).

Hong et al., *Science*, 286:523-528 (1999).

Huck et al., *Langmuir*, 15:6862-6867 (1999).

James et al., *Langmuir*, 14:741-744 (1998).

Jaschke, et al., "The atomic force microscope as a tool to study and manipulate local surface properties," *Biosensors & Bioelectronics*, 11(67): 601-602 (1996), Elsevier Science Ltd, UK.

Jashke et al., "Deposition of Organic Material by the Tip of a Scanning Force Microscope," Langmuir 1995, 11, 1061-1064.

Kim, et al., "Machining Oxide Thin Films with an Atomic Force Microscope: Pattern and Object Formation on the Nanometer Scale," *Science*, 257: 375-377 (1992), USA.

Kim, et al., "Polymer microstructures formed by moulding in capillaries," *Nature*, 376: 581-584 (1995), USA.

Knapp, et al., "Preparation, Comparison and Performance of Hydophobic AFM Tips," *Surf. Interface Anal.* 27, 324-331 (1999) John Wiley & Sons, Ltd.

Komeda, et al., "Octadecyltrichlorosilane self-assembled-monolayer islands as a self-patterned-mask for HF etching of $SiO_2$ on Si," *J. Vac. Sci. Technol. A*, 16(3): 1680-1685 (1998), American Vacuum Society, USA.

Kumar, et al., "The Use of Self-Assembled Monolayers and a Selective Etch to Generate Patterned Gold Features," *J. Am. Chem. Soc.*, 114: 9188-9189 (1992), USA.

Lahiri et al., *Langmuir*, 15:2055-2060 (1999).

Lercel, et al., "Sub-10 nm lithography with self-assembled monolayers," *Appl. Phys. Lett.*, 68(11): 1504-1506 (1996), American Institute of Physics, USA.

Li et al., *J. Am. Chem. Soc.* 123:2105-2106 (2001).

Lo et al., *Langmuir*, 15:6522-6526 (1999).

Lutwyche et al., Sensors and Actuators, 73:89-94 (1999).

Mamin, et al., "Gold deposition from a scanning tunneling microscope tip," *Journal of Vacuum Science & Technology B*, vol. 9, No. 2, Part II, 1398-1402 (1991).

Marshall, *Science*, 292:2411-2412 (2001).

Maynor et al., *Langmuir*, 17:2575-2578 (2001).

McCord, et al., "Lift-off metallization using poly(methyl methacrylate) exposed with a scanning tunneling microscope," *J. Vac. Sci. Technol. B.*, 6(1): 293-296 (1988), American Vacuum Society, USA.

McCormack et al., "Tiled Polygon Traversal Using Half-Plane Edge Functions" Compaq Computer Corporation (2000).

Minne et al., *Appl. Phys. Lett.*, 72(18):2340-2342 (1998).

Minne et al., *Appl. Phys. Lett.*, 73(12):1742-1744 (1998).

Mirkin et al., *ChemPhysChem*, 2:37-39 (2001).

Müller et al., *Science*, 268:272-273 (1995).

Muller, et al., "Nanostructuring of alkanethiols with ultrasharp field emitters," *J. Vac. Sci. Technol. B.*, (13):6 2846-2849 (1995), American Vacuum Society, USA.

Noy et al., "Chemically-Sensitive Imaging in Tapping Mode by Chemical force Microscopy: Relationship between Phase Lag and Adhesion," *Langmuir*, 14, 1508-1511, (1998).

Noy, et al., "Chemical Force Microscopy: Exploiting Chemically-Modified Tips To Quantify Adhesion, Friction, and Functional Group Distributions in Molecular Assemblies," *J. Am. Chem. Soc.*, 117(30): 7943-7951 (1995), American Chemical Society, USA.

Nyffenegger et al., Nanometer-Scale Surface Modification Using the Scanning Probe Microscope: Progress since 1991, *Chem. Rev.*, 97, 1195-1230 (1997).

Perkins, et al., "Fabrication of 15 nm wide trenches in Si by vacuum scanning tunneling microscope lithography of an organosilane self-assembled film and reactive ion etching," *Appl. Phys. Lett.*, 68(4): 550-552 (1996), American Institute of Physics, USA.

Piner et al., *Langmuir*, 15:5457-5460 (1999).

Piner, et al., ""Dip-Pen" Nanolithography," *Science*, 283: 661-664 (1999), USA.

Piner, et al., "Effect of Water on Lateral Force Microscopy in Air," *Langmuir*, 13(26): 6864-6868 (1997), American Chemical Society, USA.

Reed, et al., "Conductance of a Molecular Junction," *Science*, 278: 252-254 (1997), USA.

Ritter, *C&EN*, p. 40 (2001).

Ritter, *C&EN*, pp. 24-31, (Nov. 12, 2001).

Ross, et al., "Scanning Probe Lithography. 1. Scanning Tunneling Microscope Induced Lithography of Self-Assembled *n*-Alkanethiol Monolayer Resists," *Langmuir*, 9(3): 632-636 (1993), USA.

Schoer, et al., "Scanning Probe Lithography. 4. Characterization of Scanning Tunneling Microscope-Induced Patterns in *n*-Alkanethiol Self-Assembled Monolayers," *Langmuir*, 13(8): 2323-2332 (1997), American Chemical Society, USA.

Schwartz, *Langmuir*, 17:5971 (2001).

Service, *Science*, 286:389-391 (1999).

Silver, et al., "Direct writing of submicron metallic features with a scanning tunneling microscope," *Appl. Phys. Lett.*, 51(4): 247-249 (1987), American Institute of Physics, USA.

Sondag-Huethorst, et al., "Generation of electrochemically deposited metal patterns by means of electron beam (nano)lithography of self-assembled monolayer resists," *Appl. Phys. Lett.*, 64(3): 285-287 (1994), American Institute of Physics, USA.

Sonnenfeld, et al., "Tunneling microscopy in an electrochemical cell: Images of Ag plating," *Appl. Phys. Lett.*, 49(18): 1172-1174 (1986), American Institute of Physics, USA.

Su, et al., "A Novel Method of Real-time Size Control of Nanoaggregates by AFM," *Chemistry Letters*, 12, 1205-1206 (1997); The Chemical Society of Japan.

Sugimura, et al., "Scanning probe anodization: Nanolithography using thin films of anodically oxidizable materials as resists," *J. Vac. Sci. Technol. A.*, 14(3): 1223-1227 (1996), American Vacuum Society, USA.

Tsukamoto et al., *Rev. Sci. Instrum.*, 62(7):1767-1771 (1991).

Ulman, "An Introduction to Ultrathin Organic Films From Langmuir-Blodgett to Self-Assembly," 1991, Academic Press.

Vettiger et al., *Microelectronic Engineering*, 46:11-17 (1999).

Vezenov, et al., "Force Titrations and Ionization State Sensitive Imaging of Functional Groups in Aqueous Solutions by Chemical Force Microscopy," *J. Am. Chem. Soc.*, 119(8): 2006-2015 (1997), American Chemical Society, USA.

Weinberger et al., *Adv. Mater*, 12:1600-1603 (2000).

Wilbur et al., "Scanning Force Microscopies Can Image Patterned Self-Assembled Monolayers," *Langmuir*, 11, 825-831 (1995).

Xia, et al., "Complex Optical Surfaces Formed by Replica Molding Against Elastomeric Masters," *Science*, 273: 347-349 (1996), USA.

Xia, et al., "Soft Lithography," *Angew. Chem. Int. Ed.*, 37: 550-575 (1998), Wiley-VCH, Germany.

Xu et al., *Langmuir*, 13:127-129 (1997).

Xu, et al., "Wetting and Capillary Phenomena of Water on Mica," *J. Phys. Chem. B.*, 102: 540-548 (1998), American Chemical Society, USA.

Yan et al., *Langmuir*, 15(4):1208-1214 (1999).

Yan, et al., "Patterning a Preformed, Reactive SAM Using Microcontact Printing," *J. Am. Chem. Soc.*, vol. 120: 6179-6180 (1998), American Chemical Society, USA.

* cited by examiner

FIG. 2A
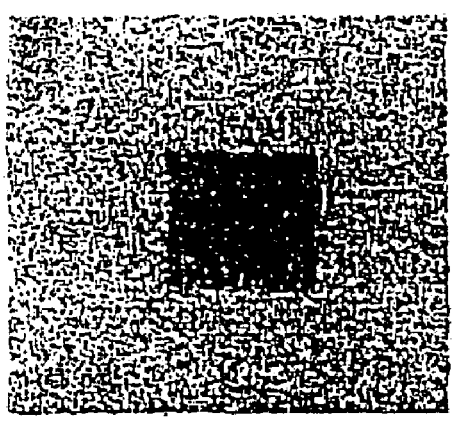
0 μm 3
FIG. 2B
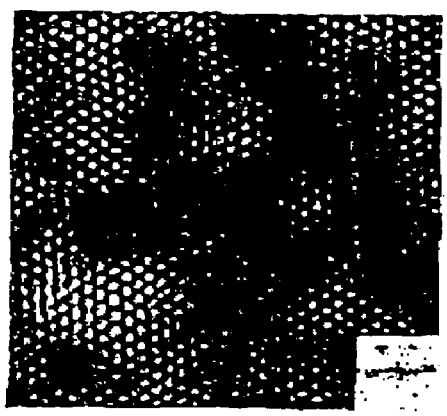
0 Å 150
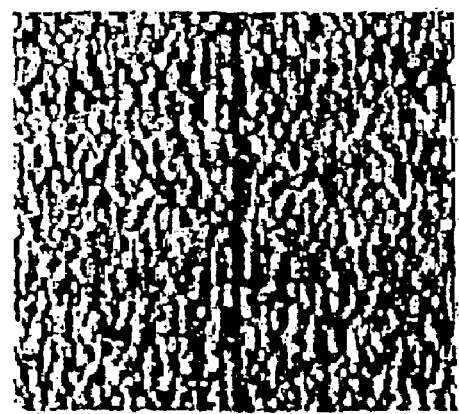
0 μm 1
FIG. 2C
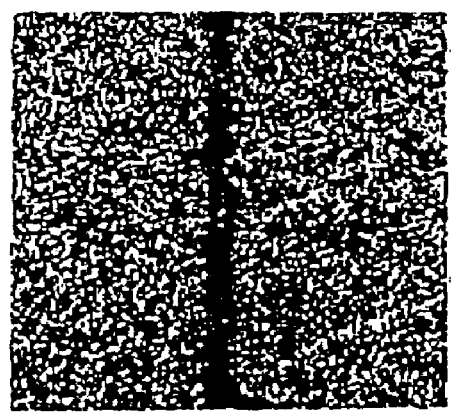
0 μm 2
FIG. 2D FIG. 5A
FIG. 5B
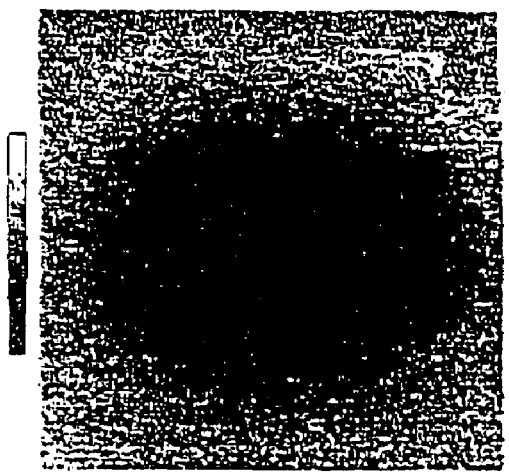
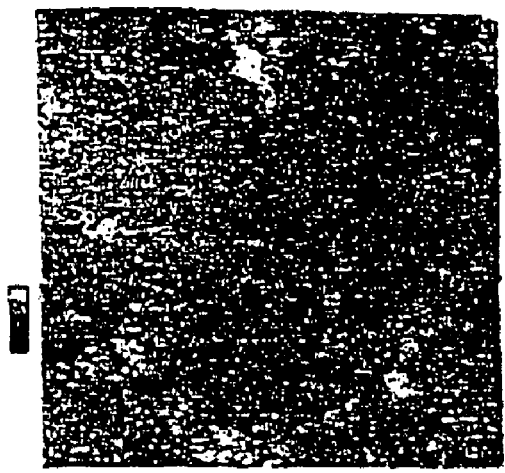

FIG. 7A
FIG. 7B
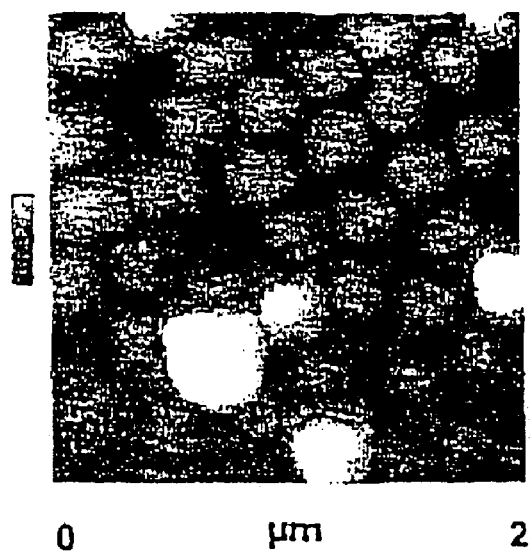
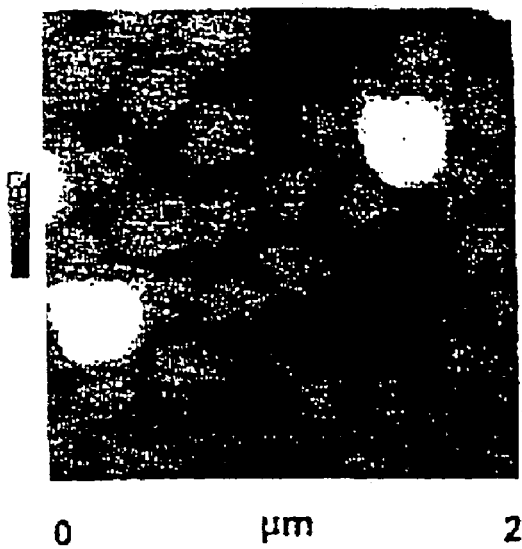

METHODS UTILIZING SCANNING PROBE MICROSCOPE TIPS AND PRODUCTS THEREFOR OR PRODUCED THEREBY

This application is a continuation of application Ser. No. 09/477,997, filed Jan. 5, 2000, now U.S. Pat. No. 6,635,311, which claims benefit of provisional application 60/115,133, filed Jan. 7, 1999, and provisional application 60/157,633, filed Oct. 4, 1999, the complete disclosures of which are incorporated herein by reference.

This invention was made with government support under grant F49620-96-1-055 from the Air Force Office Of Science Research. The government has rights in the invention.

FIELD OF THE INVENTION

This invention relates to methods of microfabrication and nanofabrication. The invention also relates to methods of performing atomic force microscope imaging.

BACKGROUND OF THE INVENTION

Lithographic methods are at the heart of modern day microfabrication, nanotechnology and molecular electronics. These methods often rely on patterning a resistive film, followed by a chemical etch of the substrate.

Dip pen technology, where ink on a sharp object is transported to a paper substrate by capillary forces, is approximately 4000 years old. Ewing, *The Fountain Pen: A Collector's Companion* (Running Press Book Publishers, Philadelphia, 1997). It has been used extensively throughout history to transport molecules on macroscale dimensions.

By the present invention, these two related but, with regard to scale and transport mechanism, disparate concepts have been merged to create "dip pen" nanolithography (DPN). DPN utilizes a scanning probe microscope (SPM) tip (e.g., an atomic force microscope (AFM) tip) as a "nib" or "pen," a solid-state substrate (e.g., gold) as "paper," and molecules with a chemical affinity for the solid-state substrate as "ink." Capillary transport of molecules from the tip to the solid substrate is used in DPN to directly write patterns consisting of a relatively small collection of molecules in submicrometer dimensions.

DPN is not the only lithographic method that allows one to directly transport molecules to substrates of interest in a positive printing mode. For example, microcontact printing, which uses an elastomer stamp, can deposit patterns of thiol-functionalized molecules directly onto gold substrates. Xia et al., *Angew. Chem. Int. Ed. Engl.*, 37:550 (1998); Kim et al., *Nature*, 376:581 (1995); Xia et al., *Science*, 273:347 (1996); Yan et al., *J. Am. Chem. Soc.*, 120:6179 (1998); Kumar et al., *J. Am. Chem. Soc.*, 114:9188 (1992). This method is a parallel technique to DPN, allowing one to deposit an entire pattern or series of patterns on a substrate of interest in one step. This is an advantage over a serial technique like DPN, unless one is trying to selectively place different types of molecules at specific sites within a particular type of nanostructure. In this regard, DPN complements microcontact printing and many other existing methods of micro- and nanofabrication.

There are also a variety of negative printing techniques that rely on scanning probe instruments, electron beams, or molecular beams to pattern substrates using self-assembling monolayers and other organic materials as resist layers (i.e., to remove material for subsequent processing or adsorption steps). Bottomley, *Anal. Chem.*, 70:425R (1998); Nyffenegger et al., *Chem. Rev.*, 97:1195 (1997); Berggren et al., *Science*, 269:1255 (1995); Sondag-Huethorst et al., *Appl. Phys. Lett.*, 64:285 (1994); Schoer et al., *Langmuir*, 13:2323 (1997); Xu et al., *Langmuir*, 13:127 (1997); Perkins et al., *Appl. Phys. Lett.*, 68:550 (1996); Carr et al., *J. Vac. Sci. Technol. A*, 15:1446 (1997); Lercel et al., *Appl. Phys. Lett.*, 68:1504 (1996); Sugimura et al., *J. Vac. Sci. Technol. A*, 14:1223 (1996); Komeda et al., *J. Vac. Sci. Technol. A*, 16:1680 (1998); Muller et al., *J. Vac. Sci. Technol. B*, 13:2846 (1995); Kim et al., *Science*, 257:375 (1992). However, DPN can deliver relatively small amounts of a molecular substance to a substrate in a nanolithographic fashion that does not rely on a resist, a stamp, complicated processing methods, or sophisticated noncommercial instrumentation.

A problem that has plagued AFM since its invention is the narrow gap capillary formed between an AFM tip and sample when an experiment is conducted in air which condenses water from the ambient and significantly influences imaging experiments, especially those attempting to achieve nanometer or even angstrom resolution. Xu et al., *J. Phys. Chem. B*, 102:540 (1998); Binggeli et al., *Appl. Phys. Lett*, 65:415 (1994); Fujihira et al., *Chem. Lett.*, 499 (1996); Piner et al., *Langmuir*, 13:6864 (1997). It has been shown that this is a dynamic problem, and water, depending upon relative humidity and substrate wetting properties, will either be transported from the substrate to the tip or vice versa. In the latter case, metastable, nanometer-length-scale patterns, could be formed from very thin layers of water deposited from the AFM tip (Piner et al., *Langmuir*, 13:6864 (1997)). The present invention shows that, when the transported molecules can anchor themselves to the substrate, stable surface structures are formed, resulting in a new type of nanolithography, DPN.

The present invention also overcomes the problems caused by the water condensation that occurs when performing AFM. In particular, it has been found that the resolution of AFM is improved considerably when the AFM tip is coated with certain hydrophobic compounds prior to performing AFM.

SUMMARY OF THE INVENTION

As noted above, the invention provides a method of lithography referred to as "dip pen" nanolithography, or DPN. DPN is a direct-write, nanolithography technique by which molecules are delivered to a substrate of interest in a positive printing mode. DPN utilizes a solid substrate as the "paper" and a scanning probe microscope (SPM) tip (e.g., an atomic force microscope (AFM) tip) as the "pen". The tip is coated with a patterning compound (the "ink"), and the coated tip is contacted with the substrate so that the patterning compound is applied to the substrate to produce a desired pattern. The molecules of the patterning compound are delivered from the tip to the substrate by capillary transport. DPN is useful in the fabrication of a variety of microscale and nanoscale devices. The invention also provides substrates patterned by DPN and kits for performing DPN.

The invention further provides a method of performing AFM imaging in air. The method comprises coating an AFM tip with a hydrophobic compound. Then, AFM imaging is performed in air using the coated tip. The hydrophobic compound is selected so that AFM imaging performed using the coated AFM tip is improved compared to AFM imaging performed using an uncoated AFM tip. Finally, the invention provides AFM tips coated with the hydrophobic compounds.

BRIEF DESCRIPTION OF THE DRAWINGS

FIG. 2A. Lateral force image of a 1 μm by 1 μm square of ODT deposited onto a Au substrate by DPN. This pattern was generated by scanning the 1 μm² area at a scan rate of 1 Hz for a period of 10 min at a relative humidity of 39%. Then the scan size was increased to 3 μm, and the scan rate was increased to 4 Hz while recording the image. The faster scan rate prevents ODT transport.

FIG. 2B. Lattice resolved, lateral force image of an ODT self-assembling monolayer (SAM) deposited onto a Au(111)/mica substrate by DPN. The image has been filtered with a fast fourier transform (FFT), and the FFT of the raw data is shown in the lower right insert. The monolayer was generated by scanning a 1000 Å square area of the Au(111)/mica substrate five times at a rate of 9 Hz under 39% relative humidity.

FIG. 2C. Lateral force image of 30 nm wide line (3 μm long) deposited onto a Au/mica substrate by DPN. The line was generated by scanning the tip in a vertical line repeatedly for five minutes at a scan rate of 1 Hz.

FIG. 2D. Lateral force image of a 100 nm line deposited on a Au substrate by DPN. The method of depositing this line is analogous to that used to generate the image in FIG. 2C, but the writing time was 1.5 minutes. Note that in all images (FIGS. 2A-2D), darker regions correspond to areas of relatively lower friction.

FIGS. 5A-B. Lateral force images showing water transported to a glass substrate (dark area) by an unmodified AFM tip (FIG. 5A) and the result of the same experiment performed with a 1-dodecylamine-coated tip (FIG. 5B). Height bars are in arbitrary units.

FIG. 7A-B. Topographic images of latex spheres, showing no changes before and after modifying tip with 1-dodecylamine. Height bars are 0.1 μm. FIG. 7A was recorded with a clean tip, and FIG. 7B was recorded with the same tip coated with 1-dodecylamine.

FIG. 8A shows the topography of a $Si_3N_4$ wafer surface that has been coated with the 1-dodecylamine molecules, which has similar features as before coating. Height bar is 700 Å. FIG. 8B shows the same area recorded in lateral force mode, showing no distinctive friction variation.

FIG. 9A shows a first pattern of 15 nm diameter 1,16-mercaptohexadecanoic acid (MHA) dots on Au(111) imaged by LFM with the MHA-coated tip used to make the dots. FIG. 9B shows a second pattern written by DPN using a coordinate for the second pattern calculated based on the LFM image of the first pattern shown in FIG. 9A. FIG. 9C shows the final pattern comprising both the first and second patterns. The elapsed time between forming the two patterns was 10 minutes.

FIG. 10A shows a first pattern comprised of 50 nm width lines and alignment marks generated with MHA molecules by DPN. FIG. 10B shows a second pattern generated with ODT molecules. The coordinates of the second pattern were adjusted based on the LFM image of the MHA alignment pattern. The first line patterns were not imaged to prevent the possible contamination by the second molecules. FIG. 10C shows the final results comprising interdigitated 50 nm width lines separated by 70 nm.

DETAILED DESCRIPTION OF THE PRESENTLY PREFERRED EMBODIMENTS

Figure 1:
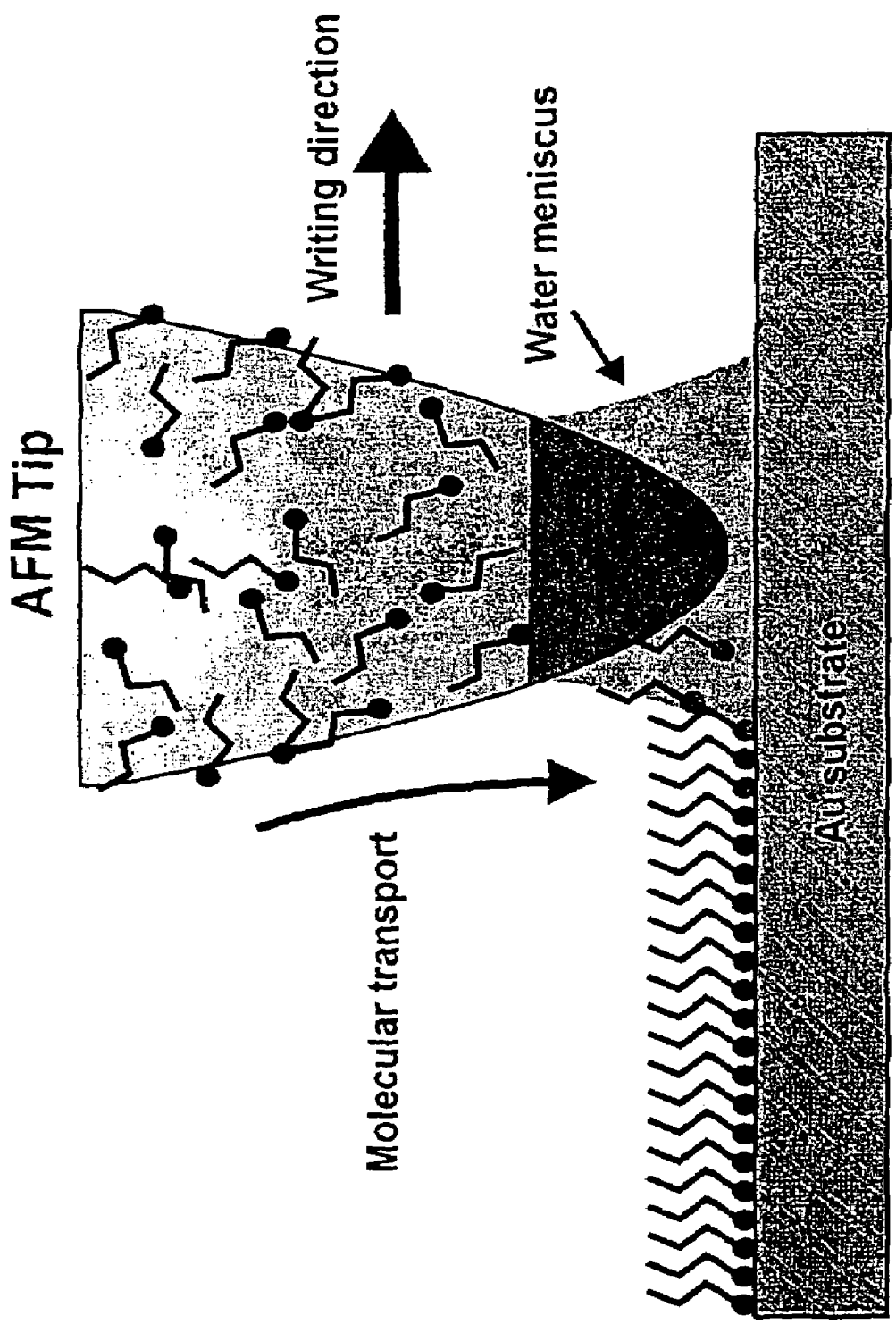
FIG. 1. Schematic representation of "dip pen" nanolithography (DPN). A water meniscus forms between the atomic force microscope (AFM) tip coated with 1-octadecanethiol (ODT) and the gold (Au) substrate. The size of the meniscus, which is controlled by relative humidity, affects the ODT transport rate, the effective tip substrate contact area, and DPN resolution.

DPN utilizes a scanning probe microscope (SPM) tip. As used herein, the phrases "scanning probe microscope tip" and "SPM tip" refer to tips used in atomic scale imaging, including atomic force microscope (AFM) tips, near field scanning optical microscope (NSOM) tips, scanning tunneling microscope (STM) tips, and devices having similar properties. Many SPM tips are available commercially, and similar devices may be developed using the guidelines provided herein.

Most preferably, the SPM tip is an AFM tip. Any AFM tip can be used. Suitable AFM tips include those that are available commercially from, e.g., Park Scientific, Digital Instruments and Molecular Imaging.

Also preferred are NSOM tips. These tips are hollow, and the patterning compounds accumulate in the hollows of the NSOM tips which serve as reservoirs of the patterning compound to produce a type of "fountain pen" for use in DPN. Suitable NSOM tips are available from Nanonics Ltd. and Topometrix.

The tip preferably is one to which the patterning compound physisorbs only. As used herein "physisorb" means that the patterning compound adheres to the tip surface by a means other than as a result of a chemical reaction (i.e., no chemisorption or covalent linkage) and can be removed from the tip surface with a suitable solvent. Physisorption of the patterning compounds to the tip can be enhanced by coating the tip with an adhesion layer and by proper choice of solvent (when one is used) for the patterning compound. The adhesion layer is a uniform, thin (<10 nm) layer of material deposited on the tip surface which does not significantly change the tip's shape. It should also be strong enough to tolerate AFM operation (force of about 10 nN). Titanium and chromium form very thin uniform layers on tips without changing tip shape significantly, and are well-suited to be used to form the adhesion layer. The tips can be coated with an adhesion layer by vacuum deposition (see Holland, *Vacuum Deposition Of Thin Films* (Wiley, New York, N.Y., 1956)), or any other method of forming thin metal films. By "proper solvent" is meant a solvent that adheres to (wets) the tip well. The proper solvent will vary depending on the patterning compound used, the type of tip used, whether or not the tip is coated with an adhesion layer, and the material used to form the adhesion layer. For example, acetonitrile adheres well to uncoated silicon nitride tips, making the use of an adhesion layer unnecessary when acetonitrile is used as the solvent for a patterning compound. In contrast, water does not adhere to uncoated silicon nitride tips. Water does adhere well to titanium-coated silicon nitride tips, and such coated tips can be used when water is used as the solvent. Physisorption of aqueous solutions of patterning compounds can also be enhanced by increasing the hydrophilicity of the tips (whether coated or uncoated with an adhesion layer). For instance, hydrophilicity can be increased by cleaning the tips (e.g., with a piranha solution, by plasma cleaning, or with UV ozone cleaning) or by oxygen plasma etching. See Lo et al., *Langmuir*, 15, 6522-6526 (1999); James et al., *Langmuir*, 14, 741-744 (1998). Alternatively, a mixture of water and another solvent (e.g., 1:3 ratio of water:acetonitrile) may adhere to uncoated silicon nitride tips, making the use of an adhesion layer or treatment to increase hydrophilicity unnecessary. The proper solvent for a particular set of circumstances can be determined empirically using the guidance provided herein.

The substrate may be of any shape and size. In particular, the substrate may be flat or curved. Substrates may be made of any material which can be modified by a patterning compound to form stable surface structures (see below). Substrates useful in the practice of the invention include metals (e.g., gold, silver, aluminum, copper, platinum, and palladium), metal oxides (e.g., oxides of Al, Ti, Fe, Ag, Zn, Zr, In, Sn and Cu), semiconductor materials (e.g., Si, CdSe, CdS and CdS coated with ZnS), magnetic materials (e.g., ferromagnetite), polymers or polymer-coated substrates, superconductor materials ($YBa_2Cu_3O_{7-\delta}$), Si, $SiO_2$, glass, AgI, AgBr, $HgI_2$, PbS, PbSe, ZnSe, ZnS, ZnTe, CdTe, InP, $In_2O_3/SnO_2$, $In_2S_3$, $In_2Se_3$, $In_2Te_3$, $Cd_3P_2$, $Cd_3As_2$, InAs, AlAs, GaP, and GaAs. Methods of making such substrates are well-known in the art and include evaporation and sputtering (metal films), crystal semiconductor growth (e.g., Si, Ge, GaAs), chemical vapor deposition (semiconductor thin films), epitaxial growth (crystalline semiconductor thim films), and thermal shrinkage (oriented polymers). See, e.g., Alcock et al., *Canadian Metallurgical Quarterly*, 23, 309 (1984); Holland, *Vacuum Deposition of Thin Films* (Wiley, New York 1956); Grove, *Philos. Trans. Faraday Soc.*, 87 (1852); Teal, *IEEE Trans. Electron Dev.* ED-23, 621 (1976); Sell, *Key Eng. Materials*, 58, 169 (1991); Keller et al., *Float-Zone Silicon* (Marcel Dekker, New York, 1981); Sherman, *Chemical Vapor Deposition For Microelectronics: Principles, Technology And Applications* (Noyes, Park Ridges, N.J., 1987); *Epitaxial Silicon Technology* (Baliga, ed., Academic Press, Orlando, Fla., 1986); U.S. Pat. No. 5,138,174; Hidber et al., *Langmuir*, 12, 5209-5215 (1996). Suitable substrates can also be obtained commercially from, e.g., Digital Instruments (gold), Molecular Imaging (gold), Park Scientific (gold), Electronic Materials, Inc. (semiconductor wafers), Silicon Quest, Inc. (semiconductor wafers), MEMS Technology Applications Center, Inc. (semiconductor wafers), Crystal Specialties, Inc. (semiconductor wafers), Siltronix, Switzerland (silicon wafers), Aleene's, Buellton, Calif. (biaxially-oriented polystyrene sheets), and Kama Corp., Hazelton, Pa. (oriented thin films of polystyrene).

The SPM tip is used to deliver a patterning compound to a substrate of interest. Any patterning compound can be used, provided it is capable of modifying the substrate to form stable surface structures. Stable surface structures are formed by chemisorption of the molecules of the patterning compound onto the substrate or by covalent linkage of the molecules of the patterning compound to the substrate.

Many suitable compounds which can be used as the patterning compound, and the corresponding substrate(s) for the compounds, are known in the art. For example:

a. Compounds of the formula $R_1SH$, $R_1SSR_2$, $R_1SR_2$, $R_1SO_2H$, $(R_1)_3P$, $R_1NC$, $R_1CN$, $(R_1)_3N$, $R_1COOH$, or ArSH can be used to pattern gold substrates;

b. Compounds of formula $R_1SH$, $(R_1)_3N$, or ArSH can be used to pattern silver, copper, palladium and semiconductor substrates;

c. Compounds of the formula $R_1NC$, $R_1SH$, $R_1SSR_2$, or $R_1SR_2$ can be used to pattern platinum substrates;

d. Compounds of the formula $R_1SH$ can be used to pattern aluminum, $TiO_2$, $SiO_2$, GaAs and InP substrates;

e. Organosilanes, including compounds of the formula $R_1SiCl_3$, $R_1Si(OR_2)_3$, $(R_1COO)_2$, $R_1CH=CH_2$, $R_1Li$ or $R_1MgX$, can be used to pattern Si, $SiO_2$ and glass substrates;

f. Compounds of the formula $R_1COOH$ or $R_1CONHR_2$ can be used to pattern metal oxide substrates;

g. Compounds of the formula $R_1SH$, $R_1NH_2$, $ArNH_2$, pyrrole, or pyrrole derivatives wherein $R_1$ is attached to one of the carbons of the pyrrole ring, can be used to pattern cuprate high temperature superconductors;

h. Compounds of the formula $R_1PO_3H_2$ can be used to pattern $ZrO_2$ and $In_2O_3/SnO_2$ substrates;

i. Compounds of the formula $R_1COOH$ can be used to pattern aluminum, copper, silicon and platinum substrates;

j. Compounds that are unsaturated, such as azoalkanes ($R_3NNR_3$) and isothiocyanates ($R_3NCS$), can be used to pattern silicon substrates;

k. Proteins and peptides can be used to pattern, gold, silver, glass, silicon, and polystyrene.

In the above formulas:

$R_1$ and $R_2$ each has the formula $X(CH_2)n$ and, if a compound is substituted with both $R_1$ and $R_2$, then $R_1$ and $R_2$ can be the same or different;

$R_3$ has the formula $CH_3(CH_2)n$;

n is 0-30;

Ar is an aryl;

X is —CH$_3$, —CHCH$_3$, —COOH, —CO$_2$(CH$_2$)$_m$CH$_3$, —OH, —CH$_2$OH, ethylene glycol, hexa(ethylene glycol), —O(CH$_2$)$_m$CH$_3$, —NH$_2$, —NH(CH$_2$)$_m$NH$_2$, halogen, glucose, maltose, fullerene C60, a nucleic acid (oligonucleotide, DNA, RNA, etc.), a protein (e.g., an antibody or enzyme) or a ligand (e.g., an antigen, enzyme substrate or receptor); and m is 0-30.

For a description of patterning compounds and their preparation and use, see Xia and Whitesides, *Angew. Chem. Int. Ed.*, 37, 550-575 (1998) and references cited therein; Bishop et al., *Curr. Opinion Colloid & Interface Sci.*, 1, 127-136 (1996); Calvert, *J. Vac. Sci. Technol. B*, 11, 2155-2163 (1993); Ulman, *Chem. Rev.*, 96:1533 (1996) (alkanethiols on gold); Dubois et al., *Annu. Rev. Phys. Chem.*, 43:437 (1992) (alkanethiols on gold); Ulman, *An Introduction to Ultrathin Organic Films: From Langmuir-Blodgett to Self-Assembly* (Academic, Boston, 1991) (alkanethiols on gold); Whitesides, *Proceedings of the Robert A. Welch Foundation 39th Conference On Chemical Research Nanophase Chemistry*, Houston, Tex., pages 109-121 (1995) (alkanethiols attached to gold); Mucic et al. *Chem. Commun.* 555-557 (1996) (describes a method of attaching 3' thiol DNA to gold surfaces); U.S. Pat. No. 5,472,881 (binding of oligonucleotide-phosphorothiolates to gold surfaces); Burwell, *Chemical Technology*, 4, 370-377 (1974) and Matteucci and Caruthers, *J. Am. Chem. Soc.*, 103, 3185-3191 (1981) (binding of oligonucleotides-alkylsiloxanes to silica and glass surfaces); Grabar et al., *Anal. Chem.*, 67, 735-743 (binding of aminoalkylsiloxanes and for similar binding of mercaptoalkylsiloxanes); Nuzzo et al., *J. Am. Chem. Soc.*, 109, 2358 (1987) (disulfides on gold); Allara and Nuzzo, *Langmuir*, 1, 45 (1985) (carboxylic acids on aluminum); Allara and Tompkins, *J. Colloid Interface Sci.*, 49, 410-421 (1974) (carboxylic acids on copper); Iler, *The Chemistry Of Silica*. Chapter 6, (Wiley 1979) (carboxylic acids on silica); Timmons and Zisman, *J. Phys. Chem.*, 69, 984-990 (1965) (carboxylic acids on platinum); Soriaga and Hubbard, *J. Am. Chem. Soc.*, 104, 3937 (1982) (aromatic ring compounds on platinum); Hubbard, *Acc. Chem. Res.*, 13, 177 (1980) (sulfolanes, sulfoxides and other functionalized solvents on platinum); Hickman et al., *J. Am. Chem. Soc.*, 111, 7271 (1989) (isonitriles on platinum); Maoz and Sagiv, *Langmuir*, 3, 1045 (1987) (silanes on silica); Maoz and Sagiv, *Langmuir*, 3, 1034 (1987) (silanes on silica); Wasserman et al., *Langmuir*, 5, 1074 (1989) (silanes on silica); Eltekova and Eltekov, *Langmuir*, 3, 951 (1987) (aromatic carboxylic acids, aldehydes, alcohols and methoxy groups on titanium dioxide and silica); and Lec et al., *J. Phys. Chem.*, 92, 2597 (1988) (rigid phosphates on metals); Lo et al., *J. Am. Chem. Soc.*, 118, 11295-11296 (1996) (attachment of pyrroles to superconductors); Chen et al., *J. Am. Chem. Soc.*, 117, 6374-5 (1995) (attachment of amines and thiols to superconductors); Chen et al., *Langmuir*, 12, 2622-2624 (1996) (attachment of thiols to superconductors); McDevitt et al., U.S. Pat. No. 5,846,909 (attachment of amines and thiols to superconductors); Xu et al., *Langmuir*, 14, 6505-6511 (1998) (attachment of amines to superconductors); Mirkin et al., *Adv. Mater. (Weinheim, Ger.)*, 9, 167-173 (1997) (attachment of amines to superconductors); Hovis et al., *J. Phys. Chem. B*, 102, 6873-6879 (1998) (attachment of olefins and dienes to silicon); Hovis et al., *Surf. Sci.*, 402-404, 1-7 (1998) (attachment of olefins and dienes to silicon); Hovis et al., *J. Phys. Chem. B*, 101, 9581-9585 (1997) (attachment of olefins and dienes to silicon); Hamers et al., *J. Phys. Chem. B*, 101, 1489-1492 (1997) (attachment of olefins and dienes to silicon); Hamers et al., U.S. Pat. No. 5,908,692 (attachment of olefins and dienes to silicon); Ellison et al., *J. Phys. Chem. B*, 103, 6243-6251 (1999) (attachment of isothiocyanates to silicon); Ellison et al., *J. Phys. Chem. B*, 102, 8510-8518 (1998) (attachment of azoalkanes to silicon); Ohno et al., *Mol. Cryst. Liq. Cryst. Sci. Technol., Sect. A*, 295, 487-490 (1997) (attachment of thiols to GaAs); Reuter et al., *Mater. Res. Soc. Symp. Proc.*, 380, 119-24 (1995) (attachment of thiols to GaAs); Bain, *Adv. Mater. (Weinheim, Fed. Repub. Ger.)*, 4, 591-4 (1992) (attachment of thiols to GaAs); Sheen et al., *J. Am. Chem. Soc.*, 114, 1514-15 (1992) (attachment of thiols to GaAs); Nakagawa et al., *Jpn. J. Appl. Phys., Part 1*, 30, 3759-62 (1991) (attachment of thiols to GaAs); Lunt et al., *J. Appl. Phys.*, 70, 7449-67 (1991) (attachment of thiols to GaAs); Lunt et al., *J. Vac. Sci. Technol., B*, 9, 2333-6 (1991) (attachment of thiols to GaAs); Yamamoto et al., *Langmuir ACS ASAP*, web release number Ia990467r (attachment of thiols to InP); Gu et al., *J. Phys. Chem. B*, 102, 9015-9028 (1998) (attachment of thiols to InP); Menzel et al., *Adv. Mater. (Weinheim, Ger.)*, 11, 131-134 (1999) (attachment of disulfides to gold); Yonezawa et al., *Chem. Mater.*, 11, 33-35 (1999) (attachment of disulfides to gold); Porter et al., *Langmuir*, 14, 7378-7386 (1998) (attachment of disulfides to gold); Son et al., *J. Phys. Chem.*, 98, 8488-93 (1994) (attachment of nitrites to gold and silver); Steiner et al., *Langmuir*, 8, 2771-7 (1992) (attachment of nitrites to gold and copper); Solomun et al., *J. Phys. Chem.*, 95, 10041-9 (1991) (attachment of nitrites to gold); Solomun et al., *Ber. Bunsen-Ges. Phys. Chem.*, 95, 95-8 (1991) (attachment of nitrites to gold); Henderson et al., *Inorg. Chim. Acta*, 242, 115-24 (1996) (attachment of isonitriles to gold); Hue et al., *J. Phys. Chem. B*, 103, 10489-10495 (1999) (attachment of isonitriles to gold); Hickman et al., *Langmuir*, 8, 357-9 (1992) (attachment of isonitriles to platinum); Steiner et al., *Langmuir*, 8, 90-4 (1992) (attachment of amines and phospines to gold and attachment of amines to copper); Mayya et al., *J. Phys. Chem. B*, 101, 9790-9793 (1997) (attachment of amines to gold and silver); Chen et al., *Langmuir*, 15, 1075-1082 (1999) (attachment of carboxylates to gold); Tao, *J. Am. Chem. Soc.*, 115, 4350-4358 (1993) (attachment of carboxylates to copper and silver); Laibinis et al., *J. Am. Chem. Soc.*, 114, 1990-5 (1992) (attachment of thiols to silver and copper); Laibinis et al., *Langmuir*, 7, 3167-73 (1991) (attachment of thiols to silver); Fenter et al., *Langmuir*, 7, 2013-16 (1991) (attachment of thiols to silver); Chang et al., *Am. Chem. Soc.*, 116, 6792-805 (1994) (attachment of thiols to silver); Li et al., *J. Phys. Chem.*, 98, 11751-5 (1994) (attachment of thiols to silver); Li et al., *Report*, 24 pp (1994) (attachment of thiols to silver); Tarlov et al., U.S. Pat. No. 5,942,397 (attachment of thiols to silver and copper); Waldeck, et al., PCT application WO/99/48682 (attachment of thiols to silver and copper); Gui et al., *Langmuir*, 7, 955-63 (1991) (attachment of thiols to silver); Walczak et al., *J. Am. Chem. Soc.*, 113, 2370-8 (1991) (attachment of thiols to silver); Sangiorgi et al., *Gazz. Chim. Ital.*, 111, 99-102 (1981) (attachment of amines to copper); Magallon et al., *Book of Abstracts, 215th ACS National Meeting*, Dallas, Mar. 29-Apr. 2, 1998, COLL-048 (attachment of amines to copper); Patil et al., *Langmuir*, 14, 2707-2711 (1998) (attachment of amines to silver); Sastry et al., *J. Phys. Chem. B*, 101, 4954-4958 (1997) (attachment of amines to silver); Bansal et al., *J. Phys. Chem. B*, 102, 4058-4060 (1998) (attachment of alkyl lithium to silicon); Bansal et al., *J. Phys. Chem. B*, 102, 1067-1070 (1998) (attachment of alkyl lithium to silicon); Chidsey, *Book of Abstracts, 214th ACS National Meeting*, Las Vegas, Nev., Sep. 7-11, 1997, I&EC-027 (attachment of alkyl lithium to silicon); Song, J. H., Thesis, University of California at San Diego (1998) (attachment of alkyl lithium to silicon dioxide); Meyer et al., *J. Am. Chem. Soc.*, 110, 4914-18 (1988) (attachment of amines to semiconductors); Brazdil et al. *J. Phys. Chem.*, 85, 1005-14 (1981) (attachment of amines to semiconductors); James et al., *Langmuir*, 14, 741-744 (1998) (attachment of proteins and peptides to glass); Bernard et al., *Langmuir*, 14, 2225-2229 (1998) (attachment of proteins to glass, polystyrene, gold, silver and silicon wafers).

Other compounds known in the art besides those listed above, or which are developed or discovered using the guidelines provided herein or otherwise, can also be used as the patterning compound. Presently preferred are alkanethiols and arylthiols on a variety of substrates and trichlorosilanes on $SiO_2$ substrates. (see Examples 1 and 2).

To practice DPN, the SPM tip is coated with a patterning compound. This can be accomplished in a number of ways. For instance, the tip can be coated by vapor deposition, by direct contact scanning, or by bringing the tip into contact with a solution of the patterning compound.

The simplest method of coating the tips is by direct contact scanning. Coating by direct contact scanning is accomplished by depositing a drop of a saturated solution of the patterning compound on a solid substrate (e.g., glass or silicon nitride; available from Fisher Scientific or MEMS Technology Application Center). Upon drying, the patterning compound forms a microcrystalline phase on the substrate. To coat the patterning compound on the SPM tip, the tip is scanned repeatedly across this microcrystalline phase. While this method is simple, it does not lead to the best loading of the tip, since it is difficult to control the amount of patterning compound transferred from the substrate to the tip.

The tips can also be coated by vapor deposition. See Sherman, *Chemical Vapor Deposition For Microelectronics: Principles, Technology And Applications* (Noyes, Park Ridges, N.J., 1987. Briefly, a patterning compound (in pure form, solid or liquid, no solvent) is placed on a solid substrate (e.g., glass or silicon nitride; obtained from Fisher Scientific or MEMS Technology Application Center), and the tip is position near (within about 1-20 cm, depending on chamber design) the patterning compound. The compound is then heated to a temperature at which it vaporizes, thereby coating the tip with the compound. For instance, 1-octadecanethiol can be vapor deposited at 60° C. Coating by vapor deposition should be performed in a closed chamber to prevent contamination of other areas. If the patterning compound is one which is oxidized by air, the chamber should be a vacuum chamber or a nitrogen-filled chamber. Coating the tips by vapor deposition produces thin, uniform layers of patterning compounds on the tips and gives very reliable results in DPN.

Preferably, however, the SPM tip is coated by dipping the tip into a solution of the patterning compound. The solvent is not critical; all that is required is that the compound be in solution. However, the solvent is preferably the one in which the patterning compound is most soluble. Also, the solution is preferably a saturated solution. In addition, the solvent is preferably one that adheres to (wets) the tip (uncoated or coated with an adhesion layer) very well (see above). The tip is maintained in contact with the solution of the patterning compound for a time sufficient for the compound to coat the tip. Such times can be determined empirically. Generally, from about 30 seconds to about 3 minutes is sufficient. Preferably, the tip is dipped in the solution multiple times, with the tip being dried between each dipping. The number of times a tip needs to be dipped in a chosen solution can be determined empirically. Preferably, the tip is dried by blowing an inert gas (such as carbon tetrafluoride, 1,2-dichloro-1,1,2,2,-tetrafluoroethane, dichlorodifluoromethane, octafluorocyclobutane, trichlorofluoromethane, difluoroethane, nitrogen, nitrogen, argon or dehumidified air) not containing any particles (i.e.,  purified) over the tip. Generally, about 10 seconds of blowing with the gas at room temperature is sufficient to dry the tip. After dipping (the single dipping or the last of multiple dippings), the tip may be used wet to pattern the substrate, or it may be dried (preferably as described above) before use. A dry tip gives a low, but stable, rate of transport of the patterning compound for a long time (on the order of weeks), whereas a wet tip gives a high rate of transport of the patterning compound for a short time (about 2-3 hours). A dry tip is preferred for compounds having a good rate of transport under dry conditions (such as the compounds listed above wherein X=—$CH_3$), whereas a wet tip is preferred for compounds having a low rate of transport under dry conditions (such as the compounds listed above wherein X=—COOH).

To perform DPN, the coated tip is brought into contact with a substrate. Both the patterning compound and a transport medium are necessary for DPN since the patterning compound is transported to the substrate by capillary transport (see FIG. 1). The transport medium forms a meniscus which bridges the gap between the tip and the substrate (see FIG. 1). Thus, the tip is "in contact" with the substrate when it is close enough so that this meniscus forms. Suitable transport media include water, hydrocarbons (e.g., hexane), and solvents in which the patterning compounds are soluble (e.g., the solvent used for coating the tip—see above). Faster writing with the tip can be accomplished by using the transport medium in which the patterning compound is most soluble.

Single tips can be used to write a pattern utilizing an AFM or similar device. As is known in the art, only some STM and NSOM tips can be used in an AFM, and STM and NSOM tips which can be used in an AFM are available commercially. Two or more different patterning compounds can be applied to the same substrate to form patterns (the same or different) of the different compounds by removing the first tip coated with a first patterning compound and replacing it with another tip coated with a different patterning compound. Alternatively, a plurality of tips can be used in a single device to write a plurality of patterns (the same pattern or different patterns) on a substrate using the same or different patterning compounds. See, e.g., U.S. Pat. No. 5,666,190, which describes a device comprising multiple cantilevers and tips for patterning a substrate.

When two or more patterns and/or two or more patterning compounds (in the same or different patterns) are applied to a single substrate, a positioning (registration) system is used to align the patterns and/or patterning compounds relative to each other and/or relative to selected alignment marks. For instance, two or more alignment marks, which can be imaged by normal AFM imaging methods, are applied to the substrate by DPN or another lithographic technique (such as photolithography or e-beam lithography). The alignment marks may be simple shapes, such as a cross or rectangle. Better resolution is obtained by making the alignment marks using DPN. If DPN is used, the alignment marks are preferably made with patterning compounds which form strong covalent bonds with the substrate. The best compound for forming the alignment marks on gold substrates is 16-mercaptohexadecanoic acid. The alignment marks are imaged by normal AFM methods (such as lateral force AFM imaging, AFM topography imaging and non-contact mode AFM imaging), preferably using an SPM tip coated with a patterning compound for making a desired pattern. For this reason, the patterning compounds used to make the alignment marks should not react with the other patterning compounds which are to be used to make the desired patterns and should not be destroyed by subsequent DPN patterning. Using the imaging data, the proper parameters (position and orientation) can be calculated using simple computer programs (e.g., Microsoft Excel spreadsheet), and the desired pattern(s) deposited on the substrate using the calculated parameters. Virtually an infinite number of patterns and/or patterning compounds can be positioned using the alignment marks since the system is based on calculating positions and orientations relative to the alignment marks. To get the best results, the SPM tip positioning system which is used should be stable and not have drift problems. One AFM positioning system which meets these standards is the 100 micrometer pizoelectric tube scanner available from Park Scientific. It provides stable positioning with nanometer scale resolution.

DPN can also be used in a nanoplotter format by having a series of micron-scale wells (or other containers) containing a plurality of different patterning compounds and rinsing solutions adjacent the substrate. The tip can be dipped into a well containing a patterning compound to coat the tip, and the coated tip is used to apply a pattern to the substrate. Then the tip is rinsed by dipping it in a rinsing well or series of rinsing wells. The rinsed tip is dipped into another well to be coated with a second patterning compound and is then used to apply a pattern to the substrate with the second patterning compound. The patterns are aligned as described in the previous paragraph. The process of coating the tip with a patterning compound, applying a pattern to the substrate with this patterning compound, and rinsing the tip, can be repeated as many times as desired, and the entire process can be automated using appropriate software.

DPN can also be used to apply a second patterning compound to a first patterning compound which has already been applied to a substrate, whether by DPN or another method. The second patterning compound is chosen so that it reacts chemically or otherwise stably combines (e.g., by hybridization of two complimentary strands of nucleic acid) with the first patterning compound. See, e.g., Dubois and Nuzzo, *Annu. Rev. Phys. Chem.*, 43, 437-63 (1992); Yan et al., *Langmuir*, 15, 1208-1214 (1999); Lahiri et al., *Langmuir*, 15, 2055-2060 (1999); and Huck et al., *Langmuir*, 15, 6862-6867 (1999). As with DPN performed directly on a substrate, both the second patterning compound and a transport medium are necessary, since the second patterning compound is transported to the first patterning compound by capillary transport (see above). Third, fourth, etc., patterning compounds can also be applied to the first patterning compound, or to other patterning compounds, already on the substrate. Further, additional patterning compounds can be applied to form multiple layers of patterning compounds. Each of these additional patterning compounds may be the same or different than the other patterning compounds, and each of the multiple layers may be the same or different than the other layers and may be composed of one or more different patterning compounds.

Further, DPN can be used in combination with other lithographic techniques. For instance, DPN can be used in conjunction with microcontact printing and the other lithographic techniques discussed in the Background section above.

Several parameters affect the resolution of DPN, and its ultimate resolution is not yet clear. First, the grain size of the substrate affects DPN resolution much like the texture of paper controls the resolution of conventional writing. As shown in Example 1 below, DPN has been used to make lines 30 nm in width on a particular gold substrate. This size is the average grain diameter of the gold substrate, and it represents the resolution limit of DPN on this type of substrate. It is expected that better resolution will be obtained using smoother (smaller grain size) substrates, such as silicon. Indeed, using another, smoother gold substrate, the resolution was increased to 15 nm (see Example 4).

Second, chemisorption, covalent attachment and self-assembly all act to limit diffusion of the molecules after deposition. In contrast, compounds, such as water, which do not anchor to the substrate, form only metastable patterns of poor resolution (See Piner et al., *Langmuir*, 13:6864 (1997)) and cannot be used.

Third, the tip-substrate contact time and, thus, scan speed influence DPN resolution. Faster scan speeds and a smaller number of traces give narrower lines.

Fourth, the rate of transport of the patterning compound from the tip to the substrate affects resolution. For instance, using water as the transport medium, it has been found that relative humidity affects the resolution of the lithographic process. For example, a 30-nm-wide line (FIG. 2C) required 5 minutes to generate in a 34% relative humidity environment, whereas a 100-nm-line (FIG. 2D) required 1.5 minutes to generate in a 42% relative humidity environment. It is known that the size of the water meniscus that bridges the tip and substrate depends upon relative humidity (Piner et al., *Langmuir*, 13:6864 (1997)), and the size of the water meniscus affects the rate of transport of the patterning compound to the substrate. Further, when a wet tip is used, the water meniscus contains residual solvent is the transport medium, and the transport rate is also affected by the properties of the solvent.

Fifth, the sharpness of the tip also affects the resolution of DPN. Thus, it is expected that better resolution will be obtained using sharper tips (e.g., by changing the tips frequently, cleaning the tips before coating them, and attaching sharp structures (such as carbon nanotubes) to the ends of the tips).

In summary, DPN is a simple but powerful method for transporting molecules from SPM tips to substrates at resolutions comparable to those achieved with much more expensive and sophisticated competitive lithographic methods, such as electron-beam lithography. DPN is a useful tool for creating and functionalizing microscale and nanoscale structures. For instance, DPN can be used in the fabrication of microsensors, microreactors, combinatorial arrays, micromechanical systems, microanalytical systems, biosurfaces, biomaterials, microelectronics, microoptical systems, and nanoelectronic devices. See, e.g., Xia and Whitesides, *Angew. Chem. Int. Ed.*, 37, 550-575 (1998). DPN should be especially useful for the detailed functionalization of nanoscale devices prepared by more conventional lithographic methods. See Reed et al., *Science*, 278:252 (1997); Feldheim et al., *Chem. Soc. Rev.*, 27:1 (1998).

The invention also provides kits for performing DPN. The kits comprise one or more substrates and one or more SPM tips. The substrates and the tips are those described above. The tips may be coated with a patterning compound or may be uncoated. If the tips are uncoated, the kit may further comprise one or more containers, each container holding a patterning compound. The patterning compounds are those described above. Any suitable container can be used, such as a vial, tube or jar. The kit may further comprise materials for forming a thin solid adhesion layer to enhance physisorption of the patterning compounds to the tips as described above (such as a container of titanium or chromium), materials useful for coating the tips with the patterning compounds (such as solvents for the patterning compounds or solid substrates for direct contact scanning), and/or materials for performing lithography by methods other than DPN (see the Background section and references cited therein). Finally, the kit may comprise other reagents and items useful for performing DPN or any other lithography method, such as reagents, beakers, vials, etc.

As noted above, when an AFM is operated in air, water condenses between the tip and surface and then is transported by means of the capillary as the tip is scanned across the surface. This filled capillary, and the capillary force associated with it, significantly impede the operation of the AFM and substantially affect the imaging process.

Quite surprisingly, it has been found that AFM tips coated with certain hydrophobic compounds exhibit an improved ability to image substrates in air by AFM as compared to uncoated tips. The reason for this is that the hydrophobic molecules reduce the size of the water meniscus formed and effectively reduce friction. As a consequence, the resolution of AFM in air is increased using a coated tip, as compared to using an uncoated tip. Accordingly, coating tips with the hydrophobic molecules can be utilized as a general pretreatment for AFM tips for performing AFM in air.

Hydrophobic compounds useful for coating AFM tips for performing AFM in air must form a uniform thin coating on the tip surface, must not bind covalently to the substrate being imaged or to the tip, must bind to the tip more strongly than to the substrate, and must stay solid at the temperature of AFM operation. Suitable hydrophobic compounds include those hydrophobic compounds described above for use as patterning compounds, provided that such hydrophobic patterning compounds are not used to coat AFM tips which are used to image a corresponding substrate for the patterning compound or to coat AFM tips which are made of, or coated with, materials useful as the corresponding substrate for the patterning compound. Preferred hydrophobic compounds for most substrates are those having the formula $R_4NH_2$, wherein $R_4$ is an alkyl of the formula $CH_3(CH_2)_n$ or an aryl, and n is 0-30, preferably 10-20 (see discussion of patterning compounds above). Particularly preferred is 1-dodecylamine for AFM temperatures of operation below 74° F. (about 23.3° C.).

AFM in air using any AFM tip may be improved by coating the AFM tip with the hydrophobic compounds described in the previous paragraph. Suitable AFM tips include those described above for use in DPN.

AFM tips can be coated with the hydrophobic compounds in a variety of ways. Suitable methods include those described above for coating AFM tips with patterning compounds for use in DPN. Preferably, the AFM tip is coated with a hydrophobic compound by simply dipping the tip into a solution of the compound for a sufficient time to coat the tip and then drying the coated tip with an inert gas, all as described above for coating a tip with a patterning compound.

After the tip is coated, AFM is performed in the same manner as it would be if the tip were not coated. No changes in AFM procedures have been found necessary.

EXAMPLES

Example 1

"Dip Pen" Nanolithography with Alkanethiols on a Gold Substrate

The transfer of 1-octadecanethiol (ODT) to gold (Au) surfaces is a system that has been studied extensively. See Bain et al., *Angew. Chem. Int. Ed. Engl.*, 28:506 (1989); A. Ulman, *An Introduction to Ultrathin Organic Films: From Langmuir-Blodgett to Self-Assembly* (Academic Press, Boston, 1991); Dubois et al., *Annu. Rev. Phys. Chem.*, 43:437 (1992); Bishop et al., *Curr. Opin. Coll. Interf. Sci.*, 1:127 (1996); Alves et al., *J. Am. Chem. Soc.*, 114:1222 (1992). Au having this moderately-air-stable molecule immobilized on it can be easily differentiated from unmodified Au by means of lateral force microscopy (LFM).

When an AFM tip coated with ODT is brought into contact with a sample surface, the ODT flows from the tip to the sample by capillary action, much like a dip pen (FIG. 1). This process has been studied using a conventional AFM tip on thin film substrates that were prepared by thermally evaporating 300 Å of polycrystalline Au onto mica at room temperature. A Park Scientific Model CP AFM instrument was used to perform all experiments. The scanner was enclosed in a glass isolation chamber, and the relative humidity was measured with a hygrometer. All humidity measurements have an absolute error of ±5%. A silicon nitride tip (Park Scientific, Microlever A) was coated with ODT by dipping the cantilever into a saturated solution of ODT in acetonitrile for 1 minute. The cantilever was blown dry with compressed difluoroethane prior to use.

A simple demonstration of the DPN process involved raster scanning a tip that was prepared in this manner across a 1 μm by 1 μm section of a Au substrate (FIG. 2A). An LFM image of this section within a larger scan area (3 μm by 3 μm) showed two areas of differing contrast (FIG. 2A). The interior dark area, or region of lower lateral force, was a deposited monolayer of ODT, and the exterior lighter area was bare Au.

Formation of high-quality self-assembled monolayers (SAMs) occurred when the deposition process was carried out on Au(111)/mica, which was prepared by annealing the Au thin film substrates at 300° C. for 3 hours. Alves et al., *J. Am. Chem. Soc.*, 114:1222 (1992). In this case, it was possible to obtain a lattice-resolved image of an ODT SAM (FIG. 2B). The hexagonal lattice parameter of 5.0±0.2 Å compares well with reported values for SAMs of ODT on Au(111) (Id.) and shows that ODT, rather than some other adsorbate (water or acetonitrile), was transported from the tip to the substrate.

Although the experiments performed on Au(111)/mica provided important information about the chemical identity of the transported species in these experiments, Au(111)/mica is a poor substrate for DPN. The deep valleys around the small Au(111) facets make it difficult to draw long (micrometer) contiguous lines with nanometer widths.

The nonannealed Au substrates are relatively rough (root-mean square roughness≅2 nm), but 30 nm lines could be deposited by DPN (FIG. 2C). This distance is the average Au grain diameter of the thin film substrates and represents the resolution limit of DPN on this type of substrate. The 30-nm molecule-based line prepared on this type of substrate was discontinuous and followed the grain edges of the Au. Smoother and more contiguous lines could be drawn by increasing the line width to 100 nm (FIG. 2D) or presumably by using a smoother Au substrate. The width of the line depends upon tip scan speed and rate of transport of the alkanethiol from the tip to the substrate (relative humidity can change the transport rate). Faster scan speeds and a smaller number of traces give narrower lines.

Figure 3B:
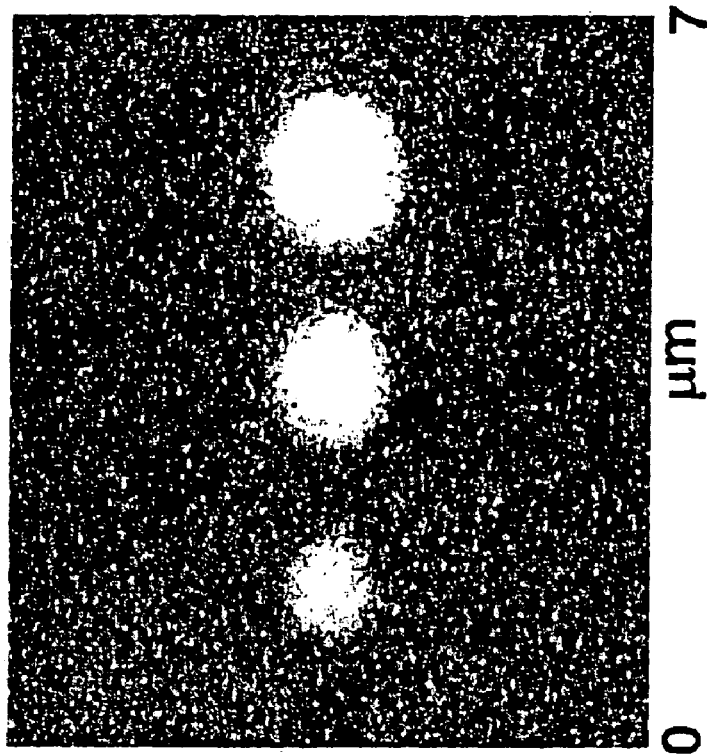
FIG. 3B. Lateral force image of 16-mercaptohexadecanoic acid (MHDA) dots on a Au substrate. To generate the dots, a MHDA-coated AFM tip was held on the Au substrate for 10, 20, and 40 seconds (left to right). The relative humidity was 35%. Note that the transport properties of MHDA and ODT differ substantially.
Figure 3A:
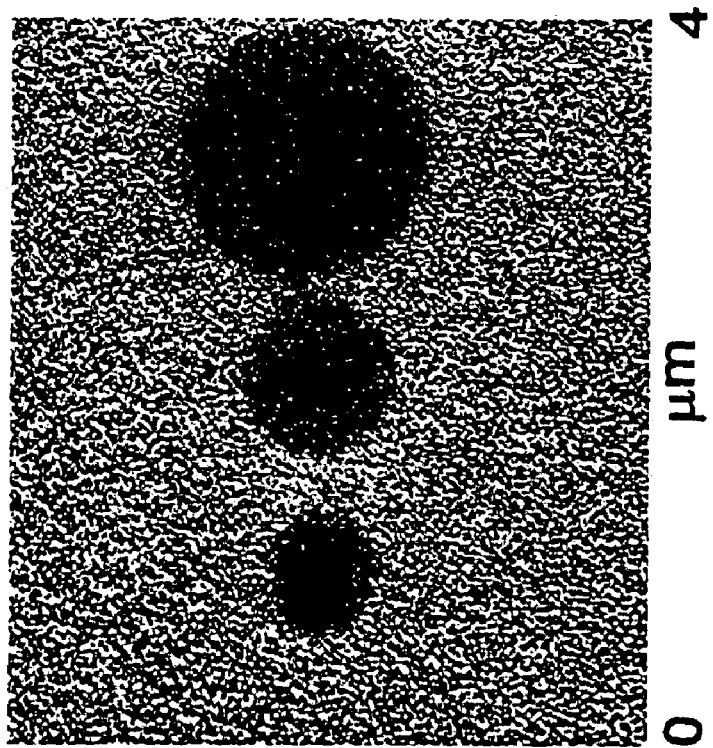
FIG. 3A. Lateral force image of a Au substrate after an AFM tip, which has been coated with ODT, has been in contact with the substrate for 2, 4, and 16 min (left to right). The relative humidity was held constant at 45%, and the image was recorded at a scan rate of 4 Hz.

DPN was also used to prepare molecular dot features to demonstrate the diffusion properties of the "ink" (FIGS. 3A and 3B). The ODT-coated tip was brought into contact (set point=1 nN) with the Au substrate for a set period of time. For example, 0.66 μm, 0.88 μm, and 1.6 μm diameter ODT dots were generated by holding the tip in contact with the surface for 2, 4, and 16 minutes, respectively (left to right, FIG. 3A). The uniform appearance of the dots likely reflects an even flow of ODT in all directions from the tip to the surface. Opposite contrast images were obtained by depositing dots of an alkanethiol derivative, 16-mercaptohexadecanoic acid in an analogous fashion (FIG. 3B). This not only provides additional evidence that the molecules are being transported from the tip to the surface but also demonstrates the molecular generality of DPN.

Figure 3C:
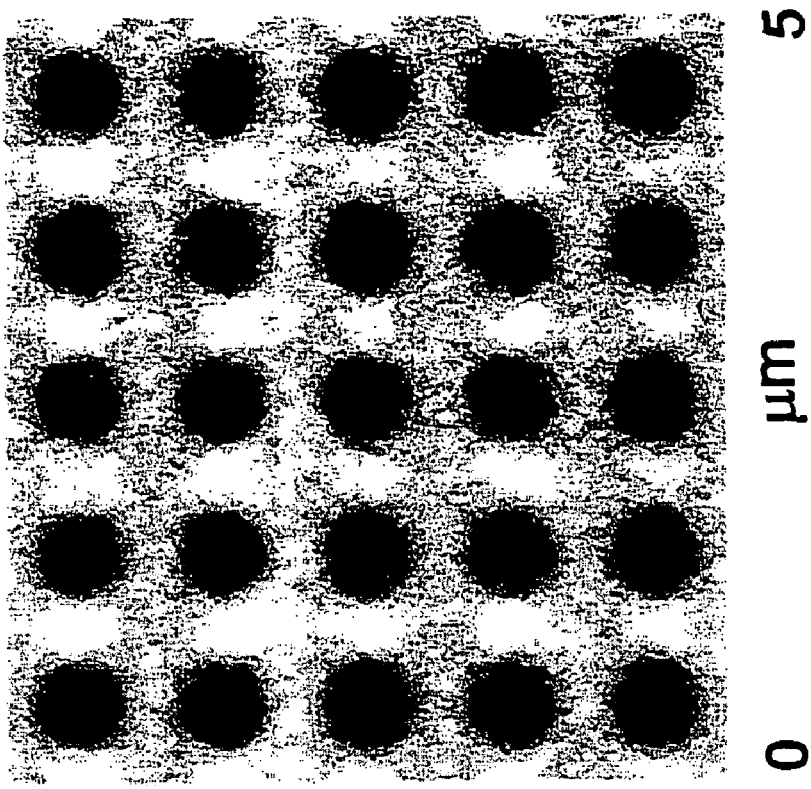
FIG. 3C. Lateral force image of an array of dots generated by DPN. Each dot was generated by holding an ODT-coated tip in contact with the surface for ~20 seconds. Writing and recording conditions were the same as in FIG. 3A.
Figure 3D:
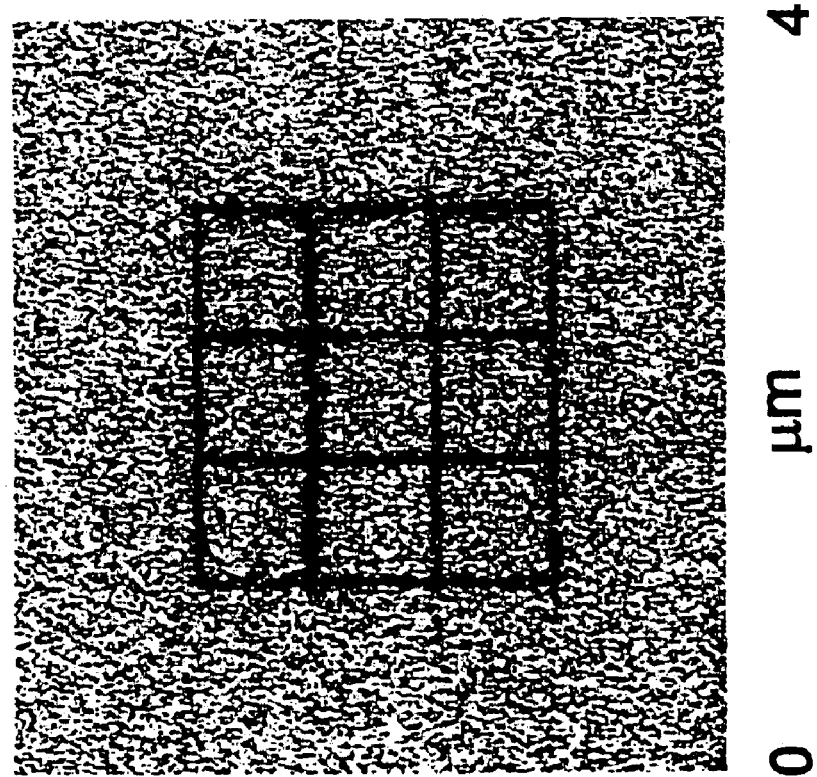
FIG. 3D. Lateral force image of a molecule-based grid. Each line, 100 nm in width and 2 μm in length, required 1.5 minutes to write.

Arrays and grids could be generated in addition to individual lines and dots. An array of twenty-five 0.46-μm diameter ODT dots spaced 0.54 μm apart (FIG. 3C) was generated by holding an ODT-coated tip in contact with the surface (1 nM) for 20 seconds at 45% relative humidity without lateral movement to form each dot. A grid consisting of eight intersecting lines 2 μm in length and 100 nm wide (FIG. 3D) was generated by sweeping the ODT-coated tip on a Au surface at a 4 μm per second scan speed with a 1 nN force for 1.5 minutes to form each line.

Example 2

"Dip Pen" Nanolithography

A large number of compounds and substrates have been successfully utilized in DPN. They are listed below in Table 1, along with possible uses for the combinations of compounds and substrates.

AFM tips (Park Scientific) were used. The tips were silicon tips, silicon nitride tips, and silicon nitride tips coated with a 10 nm layer of titanium to enhance physisorption of patterning compounds. The silicon nitride tips were coated with the titanium by vacuum deposition as described in Holland, *Vacuum Deposition Of Thin Films* (Wiley, New York, N.Y., 1956). It should be noted that coating the silicon nitride tips with titanium made the tips dull and decreased the resolution of DPN. However, titanium-coated tips are useful when water is used as the solvent for a patterning compound. DPN performed with uncoated silicon nitride tips gave the best resolution (as low as about 10 nm).

Metal film substrates listed in Table 1 were prepared by vacuum deposition as described in Holland, *Vacuum Deposition Of Thin Films* (Wiley, New York, N.Y., 1956). Semiconductor substrates were obtained from Electronic Materials, Inc., Silicon Quest, Inc. MEMS Technology Applications Center, Inc., or Crystal Specialties, Inc.

The patterning compounds listed in Table 1 were obtained from Aldrich Chemical Co. The solvents listed in Table 1 were obtained from Fisher Scientific.

The AFM tips were coated with the patterning compounds as described in Example 1 (dipping in a solution of the patterning compound followed by drying with an inert gas), by vapor deposition or by direct contact scanning. The method of Example 1 gave the best results. Also, dipping and drying the tips multiple times further improved results.

The tips were coated by vapor deposition as described in Sherman, *Chemical Vapor Deposition For Microelectronics: Principles, Technology And Applications* (Noyes, Park Ridges, N.J., 1987). Briefly, a patterning compound in pure form (solid or liquid, no solvent) was placed on a solid substrate (e.g., glass or silicon nitride; obtained from Fisher Scientific or MEMS Technology Application Center) in a closed chamber. For compounds which are oxidized by air, a vacuum chamber or a nitrogen-filled chamber was used. The AFM tip was position about 1-20 cm from the patterning compound, the distance depending on the amount of material and the chamber design. The compound was then heated to a temperature at which it vaporizes, thereby coating the tip with the compound. For instance, 1-octadecanethiol can be vapor deposited at 60° C. Coating the tips by vapor deposition produced thin, uniform layers of patterning compounds on the tips and gave quite reliable results for DPN.

The tips were coated by direct contact scanning by depositing a drop of a saturated solution of the patterning compound on a solid substrate (e.g., glass or silicon nitride; obtained from Fisher Scientific or MEMS Technology Application Center). Upon drying, the patterning compound formed a microcrystalline phase on the substrate. To load the patterning compound on the AFM tip, the tip was scanned repeatedly (~5 Hz scan speed) across this microcrystalline phase. While this method was simple, it did not lead to the best loading of the tip, since it was difficult to control the amount of patterning compound transferred from the substrate to the tip.

DPN was performed as described in Example 1 using a Park Scientific AFM, Model CP, scanning speed 5-10 Hz. Scanning times ranged from 10 seconds to 5 minutes. Patterns prepared included grids, dots, letters, and rectangles. The width of the grid lines and the lines that formed the letters ranged from 15 nm to 250 nm, and the diameters of the individual dots ranged from 12 nm to 5 micrometers.

TABLE 1

| Substrate | Patterning Compound/Solvent(s) | Potential Applications | Comments and References |
|---|---|---|---|
| Au | n-octadecanethiol/ acetonitrile, ethanol | Basic research | Study of intermolecular forces. Langmuir, 10, 3315 (1994) |
|  |  | Etching resist for microfabrication | Etchant: $KCN/O_2$(pH~14). J. Vac. Sci. Tech. B, 13, 1139 (1995) |
|  | dodecanethiol/ acetonitrile, ethanol | Molecular electronics | Insulating thin coating on nanometer scale gold clusters. Superlattices and Microstructures 18, 275 (1995) |
|  | n-hexadecanethiol/ acetonitrile, ethanol | Etching resist for microfabrication | Etchant; $KCN/O_2$(pH~14). Langmuir, 15, 300 (1999) |
|  | n-docosanethiol/ acetonitrile, ethanol | Etching resist for microfabrication | Etchant: $KCN/O_2$(pH~14). J. Vac. Sci. Technol. B, 13, 2846 (1995) |
|  | 11-mercapto-1-undecanol/ acetonitrile, ethanol | Surface functionalization | Capturing $SiO_2$ clusters |

TABLE 1-continued

| Substrate | Patterning Compound/Solvent(s) | Potential Applications | Comments and References |
|---|---|---|---|
| | 16-mercapto-1-hexadecanoic acid/ acetonitrile, ethanol | Basic research | Study of intermolecular forces. Langmuir 14, 1508 (1998) |
| | | Surface functionalization | Capturing $SiO_2$, $SnO_2$ clusters. J. Am. Chem. Soc., 114, 5221 (1992) |
| | octanedithiol/ acetonitrile, ethanol | Basic research | Study of intermolecular forces. Jpn. J. Appl. Phys. 37, L299 (1998) |
| | hexanedithiol/ acetonitrile, ethanol | Surface functionalization | Capturing gold clusters. J. Am. Chem. Soc., 114, 5221 (1992) |
| | propanedithiol/ acetonitrile, ethanol | Basic research | Study of intermolecular forces. J. Am. Chem. Soc., 114, 5221 (1992) |
| | α,α'-p-xylyldithiol/ acetonitrile, ethanol | Surface functionalization | Capturing gold clusters. Science, 272, 1323 (1996) |
| | | Molecular electronics | Conducting nanometer scale junction. Science, 272, 1323 (1996) |
| | 4,4'-biphenyldithiol/ acetonitrile, ethanol | Surface functionalization | Capturing gold and CdS clusters. Inorganica Chemica Acta 242, 115 (1996) |
| | terphenyldithiol/ acetonitrile, ethanol | Surface functionalization | Capturing gold and CdS clusters. Inorganica Chemica Acta 242, 115 (1996) |
| | terphenyldiisocyanide/ acetonitrile, methylene chloride | Surface funcationalization | Capturing gold and CdS clusters. Inorganica Chemica Acta 242, 115 (1996) |
| | | Molecular electronics | Conductive coating on nanometer scale gold clusters. Superlattices and Microstructures, 18, 275 (1995) |
| | DNA/ water:acetonitrile (1:3) | Gene detection | DNA probe to detect biological cells. J. Am. Chem. Soc. 119, 8916 (1997) |
| Ag | n-hexadecanethiol/ acetonitrile, ethanol | Etching resist for microfabrication | Etchant: $Fe(NO_3)_3$(pH~6). Microelectron. Eng., 32, 255 (1996) |
| Al | 2-mercaptoacetic acid/ acetonitrile, ethanol | Surface functionalization | Capturing CdS clusters. J. Am. Chem. Soc., 114, 5221 (1992) |
| GaAs-100 | n-octadecanethiol/ acetonitrile, ethanol | Basic research | Self assembled monolayer formation |
| | | Etching resist for microfabrication | $HCl/HNO_3$(pH~1). J. Vac. Sci. Technol. B, 11, 2823 (1993) |
| $TiO_2$ | n-octadecanethiol/ acetonitrile, ethanol | Etching resist for microfabrication | |
| $SiO_2$ | 16-mercapto-1-hexadecanoic acid/ acetonitrile, ethanol | Surface functionalization | Capturing gold and CdS clusters |
| | octadecyltrichlorosilane(OTS, $CH_3(CH_2)_{17}SiCl_3$) 1.2 nm thick SAM/ hexane | Etching resist for microfabrication | Etchant: $HF/NH_4F$ (pH~2). Appl. Phys. Left., 70,1593 (1997) |
| | APTS, 3-(2-Aminoethlyamino) propyltrimethoxy-silane/water | Surface functionalization | Capturing nanometer scale gold clusters. Appl. Phys. Lett. 70, 2759 (1997) |

Example 3

Atomic Force Microscopy with Coated Tips

As noted above, when an AFM is operated in air, water condenses between the tip and surface and then is transported by means of the capillary as the tip is scanned across the surface. Piner et al., *Langmuir* 13, 6864-6868 (1997). Notably, this filled capillary, and the capillary force associated with it, significantly impede the operation of the AFM, especially when run in lateral force mode. Noy et al., *J. Am. Chem. Soc.* 117, 7943-7951 (1995); Wilbur et al., *Langmuir* 11, 825-831 (1995). In air, the capillary force can be 10 times larger than chemical adhesion force between tip and sample. Therefore, the capillary force can substantially affect the structure of the sample and the imaging process. To make matters worse, the magnitude of this effect will depend on many variables, including the relative hydrophobicities of the tip and sample, the relative humidity, and the scan speed. For these reasons, many groups have chosen to work in solution cells where the effect can be made more uniform and reproducible. Frisbie et al., *Science* 265, 2071-2074 (1994); Noy et al., *Langmuir* 14, 1508-1511 (1998). This, however, imposes a large constraint on the use of an AFM, and solvent can affect the structure of the material being imaged. Vezenov et al., *J. Am. Chem. Soc.* 119, 2006-2015 (1997). Therefore, other methods that allow one to image in air with the capillary effect reduced or eliminated would be desirable.

This example describes one such method. The method involves the modification of silicon nitride AFM tips with a physisorbed layer of 1-dodecylamine. Such tips improve one's ability to do LFM in air by substantially decreasing the capillary force and providing higher resolution, especially with soft materials.

All data presented in this example were obtained with a Park Scientific Model CP AFM with a combined AFM/LFM head. Cantilevers (model no. MLCT-AUNM) were obtained from Park Scientific and had the following specifications: gold coated microlever, silicon nitride tip, cantilever A, spring constant=0.05 N/m. The AFM was mounted in a Park vibration isolation chamber which had been modified with a dry nitrogen purge line. Also, an electronic hygrometer, placed inside the chamber, was used for humidity measurements (±5% with a range of 12~100%). Muscovite green mica was obtained from Ted Pella, Inc. Soda lime glass microscope slides were obtained from Fisher. Polystyrene spheres with 0.23±0.002 μm diameters were purchased from Polysciences, and $Si_3N_4$ on silicon was obtained from MCNC MEMS Technology Applications Center. 1-Dodecylamine (99+%) was purchased from Aldrich Chemical Inc. and used without further purification. Acetonitrile (A.C.S. grade) was purchased from Fisher Scientific Instruments, Inc.

Two methods for coating an AFM tip with 1-dodecylamine were explored. The first method involved saturating ethanol or acetonitrile with 1-dodecylamine and then depositing a droplet of this solution on a glass substrate. Upon drying, the 1-dodecylamine formed a microcrystalline phase on the glass substrate. To load the 1-dodecylamine on the AFM tip, the tip was scanned repeatedly (~5 Hz scan speed) across this microcrystalline phase. While this method was simple, it did not lead to the best loading of the tip, since it was difficult to control the amount of 1-dodecylamine transferred from the substrate to the tip.

A better method was to transfer the dodecylamine directly from solution to the AFM cantilever. This method involved soaking the AFM cantilever and tip in acetonitrile for several minutes in order to remove any residual contaminants on the tip. Then the tip was soaked in a ~5 mM 1-dodecylamine/acetonitrile solution for approximately 30 seconds. Next, the tip was blown dry with compressed freon. Repeating this procedure several times typically gave the best results. The 1-dodecylamine is physisorbed, rather than chemisorbed, onto the silicon nitride tips. Indeed, the dodecylamine can be rinsed off the tip with acetonitrile as is the case with bulk silicon nitride. Benoit et al. *Microbeam and Nanobeam Analysis;* Springer Verlag, (1996). Modification of the tip in this manner significantly reduced the capillary effects due to atmospheric water condensation as evidenced by several experiments described below.

Figure 4:
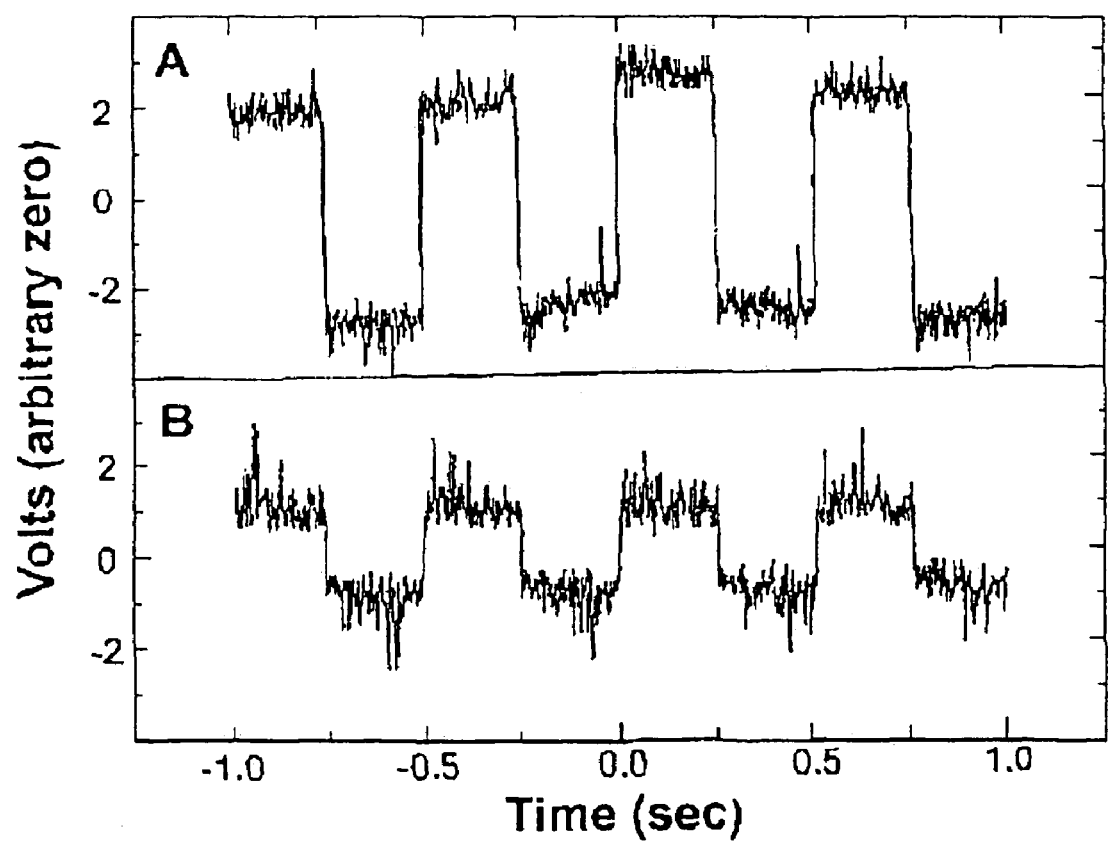
FIGS. 4A-B. Oscilloscope recordings of lateral force detector output before the AFM tip was coated with 1-dodecylamine (FIG. 4A) and after the tip had been coated with 1-dodecylamine (FIG. 4B). The time of the recording spans four scan lines. Since the signal was recorded during both left and right scans, the heights of the square waves are directly proportional to the friction. The Y-axis zero has been shifted for clarity.

First, a digital oscilloscope, directly connected to the lateral force detector of the AFM, was used to record the lateral force output as a function of time. In this experiment, the force of friction changed direction when the tip scanned left to right, as compared with right to left. Therefore, the output of the LFM detector switched polarity each time the tip scan direction changed. If one or more AFM raster scans were recorded, the output of the detector was in the form of a square wave, FIGS. 4A-B. The height of the square wave is directly proportional to the sliding friction of the tip on the sample and, therefore, one can compare the forces of friction between an unmodified tip and a glass substrate and between a modified tip and a glass substrate simply by comparing the height of the square waves under nearly identical scanning and environmental conditions. The tip/sample frictional force was at least a factor of three less for the modified tip than for the unmodified tip. This experiment was repeated on a mica substrate, and a similar reduction in friction was observed. In general, reductions in friction measured in this way and under these conditions ranged from a factor of three to more than a factor of ten less for the modified tips, depending upon substrate and environmental conditions, such as relative humidity.

While this experiment showed that 1-dodecylamine treatment of an AFM tip lowered friction, it did not prove that water and the capillary force were the key factors. In another experiment, the effects of the 1-dodecylamine coating on the capillary transport of water was examined. Details of water transport involving unmodified tips have been discussed elsewhere. Piner et al., *Langmuir* 13, 6864-6868 (1997). When an AFM tip was scanned across a sample, it transported water to the sample by capillary action, FIG. 5A. After scanning a 4 μm×5 μm area of a soda glass substrate for several minutes, contiguous adlayers of water were deposited onto the substrate and imaged by LFM by increasing the scan size. Areas of lower friction, where water had been deposited, appeared darker than non-painted areas, FIG. 5A. The same experiment conducted with a tip coated with 1-dodecylamine did not show evidence of substantial water transport, FIG. 5B. Indeed, only random variations in friction were observed.

Figure 6A:
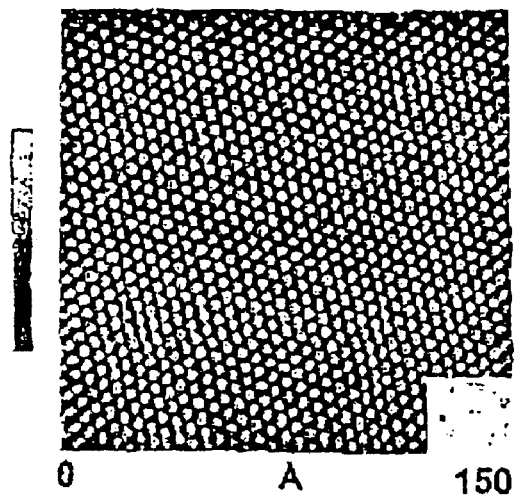
FIG. 6A. Lattice resolved, lateral force image of a mica surface with a 1-dodecylamine-coated tip. The 2D fourier transform is in the insert.

While these experiments showed that friction could be reduced and the transport of water from the tip to the substrate by capillary action could be inhibited by coating the tip with 1-dodecylamine, they did not provide information about the resolving power of the modified tip. Mica is an excellent substrate to evaluate this issue and, indeed, lattice resolved images could be routinely obtained with the modified tips, demonstrating that this modification procedure reduced the force of friction without blunting the tip, FIG. 6A. It was impossible to determine whether the portion of the tip that was involved in the imaging was bare or had a layer of 1-dodecylamine on it. In fact, it is likely that the 1-dodecylamine layer had been mechanically removed from this part of the tip exposing the bare $Si_3N_4$. In any event, the remainder of the tip must have had a hydrophobic layer of dodecylamine on it, since water was inhibited from filling the capillary surrounding the point of contact, thereby reducing the capillary effect (see above).

While the atomic scale imaging ability of the AFM was not adversely affected by the 1-dodecylamine coating on the tip, the above experiment did not provide useful information about the suitability of the tip for obtaining morphology data on a larger scale. In order to obtain such information, a sample of monodisperse 0.23 μm diameter latex spheres was imaged with both modified and unmodified tips. Since the topography recorded by an AFM is a convolution of the shape of the tip and the shape of the sample, any change in the shape of the tip will be reflected in a change in the imaged topography of the latex spheres. No detectable difference was found in images taken with unmodified and modified tips, respectively, FIGS. 7A-B. This shows that the shape of the tip was not significantly changed as it would be if a metallic coating had been evaporated onto it. Moreover, it suggests that the 1-dodecylamine coating was fairly uniform over the surface of the tip and was sharp enough that it did not adversely affect atomic scale imaging.

Figure 6B:
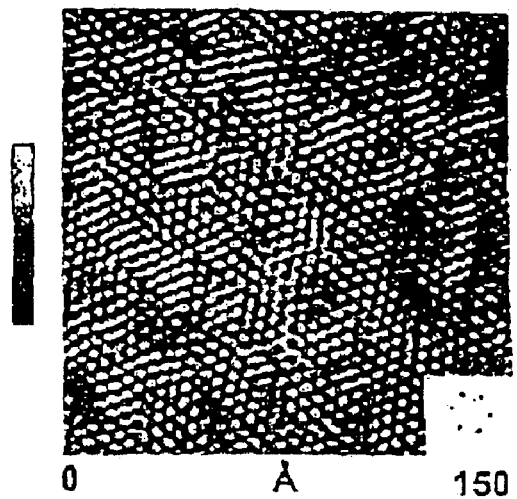
FIG. 6B. Lattice resolved, lateral force image of an self-assembled monolayer of 11-mercapto-1-undecanol. This image has been fourier transform filtered (FFT), and the FFT of the raw data is shown in lower right insert. Scale bars are arbitrary.

A significant issue pertains to the performance of the modified tips in the imaging of soft materials. Typically, it is difficult to determine whether or not a chemically-modified tip exhibits improved performance as compared with a bare tip. This is because chemical modification is often an irreversible process which sometimes requires the deposition of an intermediary layer. However, since the modification process reported herein was based upon physisorbed layers of 1-dodecylamine, it was possible to compare the performance of a tip before modification, after modification, and after the tip had been rinsed and the 1-dodecylamine had been removed. Qualitatively, the 1-dodecylamine-modified tips always provided significant improvements in the imaging of monolayers based upon alkanethiols and organic crystals deposited onto a variety of substrates. For example, a lattice resolved image of a hydrophilic self-assembled monolayer of 11-mercapto-1-undecanol on a Au(111) surface was routinely obtained with a modified tip, FIG. 6B. The lattice could not be resolved with the same unmodified AFM tip. On this surface, the coated tip showed a reduction in friction of at least a factor of five by the square wave analysis (see above). It should be noted, that the OH-terminated SAM is hydrophilic and, hence, has a strong capillary attraction to a clean tip. Reducing the capillary force by the modified tip allows one to image the lattice.

Figure 6C:
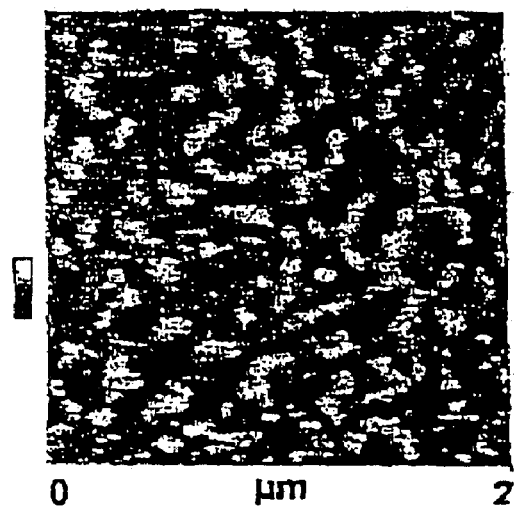
FIG. 6C. Topographic image of water condensation on mica at 30% relative humidity. The height bar is 5 Å.
Figure 6D:
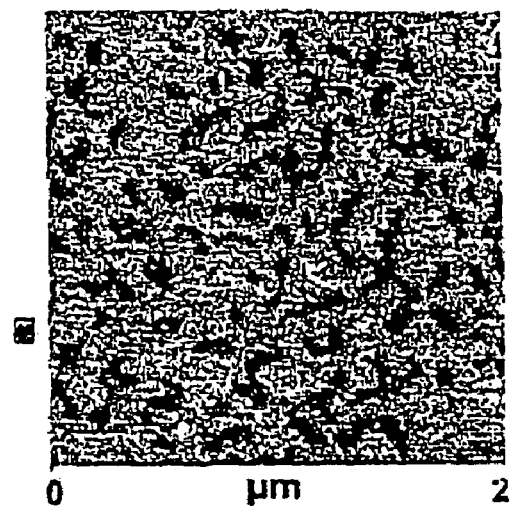
FIG. 6D. Lateral force image of water condensation on mica at 30% relative humidity (same spot as in FIG. 6C).
Figure 8B:
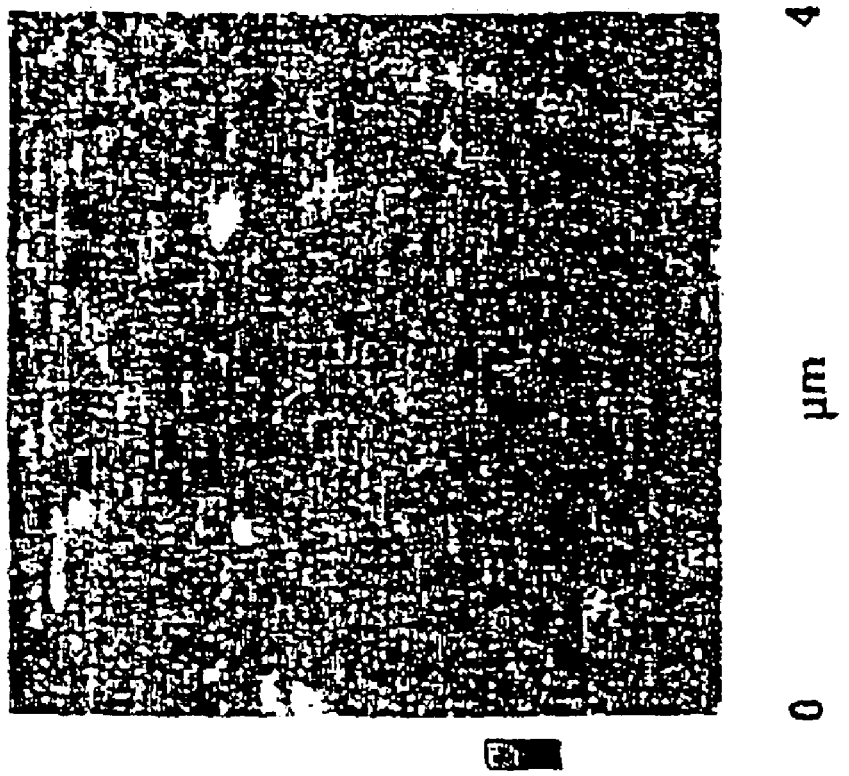
FIGS. 8A-B. Images of a $Si_3N_4$ surface coated with 1-dodecylamine molecules, showing uniform coating.
Figure 8A:
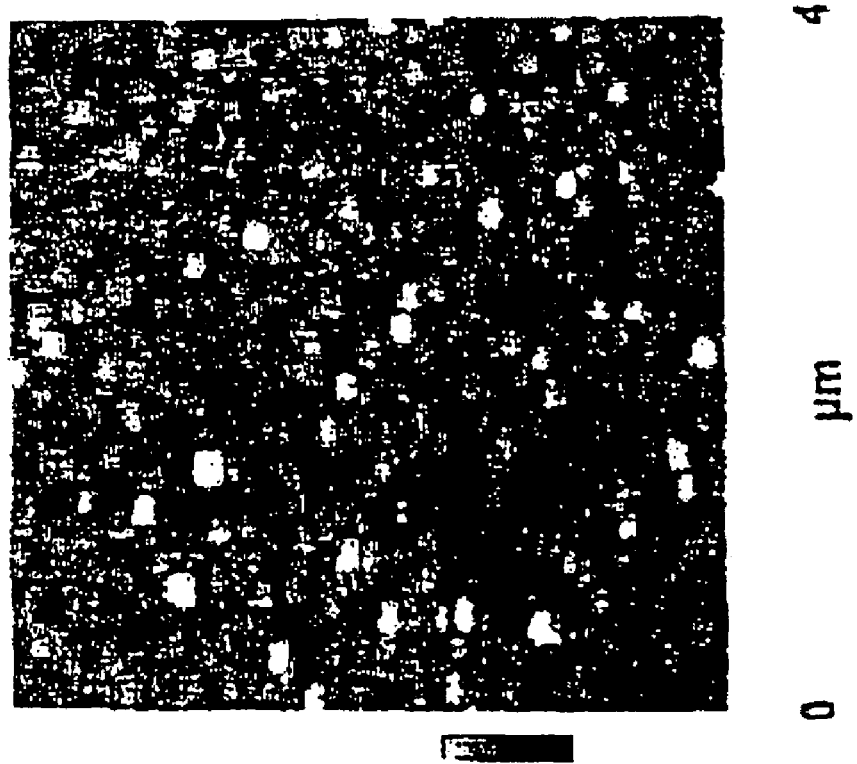

A second example of improved resolution involved imaging free standing liquid surfaces, such as water condensed on mica. It is well known that at humidities between 30 and 40 percent, water has two distinct phases on mica. Hu et al., *Science* 268, 267-269 (1995). In previous work by this group, a non-contact mode scanning polarization force microscope (SPFM) was used to image these phases. It was found that, when a probe tip came into contact with mica, strong capillary forces caused water to wet the tip and strongly disturbed the water condensate on the mica. To reduce the capillary effect so that two phases of water could be imaged, the tip was kept ~20 nm away from the surface. Because of this constraint, one cannot image such phases with a contact mode scanning probe technique. FIGS. 6C-D show images of the two phases of water on mica recorded at 30 percent humidity with a 1-dodecylamine modified tip in contact mode. The heights of the features (FIG. 6C) corresponded with the frictional map (FIG. 6D), with higher features having lower friction. The quality of the modified tip, which it is believed correlates with the uniformity of the 1-dodecylamine layer on the tip, was important. Only well modified tips made it possible to image the two phases of water, while less well modified ones resulted in poorer quality images. In fact, this was such a sensitive test that it could be used as a diagnostic indicator of the quality of the 1-dodecylamine-modified tips before proceeding to other samples.

In conclusion, this example describes a very simple, but extremely useful, method for making $Si_3N_4$ AFM tips hydrophobic. This modification procedure lowers the capillary force and improves the performance of the AFM in air. Significantly, it does not adversely affect the shape of the AFM tip and allows one to obtain lattice resolved images of hydrophilic substrates, including soft materials such as SAMs and even free-standing water, on a solid support. The development of methodology that allows one to get such information in air is extremely important because, although solution cells can reduce the effect of the capillary force, the structures of soft materials can be significantly affected by solvent. Vezenov et al., *J. Am. Soc.* 119, 2006-2015 (1997). Finally, although it might be possible to make an AFM tip more hydrophobic by first coating it with a metal layer and then derivatizing the metal layer with a hydrophobic chemisorbed organic monolayer, it is difficult to do so without concomitantly blunting the AFM tip.

Example 4

Multicomponent "Dip Pen" Nanolithography

The inability to align nanoscale lithographically generated patterns comprised of chemically distinct materials is an issue that limits the advancement of both solid-state and molecule-based nanoelectronics. Reed et al., *Science* 278, 252 (1997); Feldheim, et al., *Chem. Soc. Rev.* 27, 1 (1998). The primary reasons for this problem are that many lithographic processes: 1) rely on masking or stamping procedures, 2) utilize resist layers, 3) are subject to significant thermal drift problems, and 4) rely on optical-based pattern alignment. Campbell, *The Science and Engineering of Microelectronic Fabrication* (Oxford Press); Chou et al., *Appl. Phys. Lett.* 67, 3114 (1995); Wang et al., *Appl. Phys. Lett.* 70, 1593 (1997); Jackman et al., *Science* 269, 664(1995); Kim et al., *Nature* 376, 581 (1995); Schoer et al., *Langmuir* 13, 2323 (1997); Whelan et al., *Appl. Phys. Lett.* 69, 4245 (1996); Younkin et al., *Appl. Phys. Lett.* 71, 1261 (1997); Bottomley, *Anal. Chem.* 70, 425R. (1998); Nyffenegger and Penner, *Chem. Rev.* 97, 1195 (1997); Berggren, et al., *Science* 269, 1255 (1995); Sondag-Huethorst et al., *Appl. Phys. Lett.* 64, 285 (1994); Schoer and Crooks, *Langmuir* 13, 2323 (1997); Xu and Liu, *Langmuir* 13, 127 (1997); Perkins, et al., *Appl. Phys. Lett.* 68, 550 (1996); Carr, et al., *J. Vac. Sci. Technol. A* 15, 1446 (1997); Sugimura et al., *J. Vac. Sci. Technol. A* 14, 1223 (1996); Komeda et al., *J. Vac. Sci. Technol. A* 16, 1680 (1998); Muller et al., *J. Vac. Sci. Technol. B* 13, 2846 (1995); and Kim and M. Lieber, *Science* 257, 375 (1992).

With respect to feature size, resist-based optical methods allow one to reproducibly pattern many materials, soft or solid-state, in the >100 nm line width and spatial resolution regime, while e-beam lithography methods allow one to pattern in the 10-200 nm scale. In the case of soft-lithography, both e-beam lithography and optical methods rely on resist layers and the backfilling of etched areas with component molecules. This indirect patterning approach compromises the chemical purity of the structures generated and poses limitations on the types of materials that can be patterned. Moreover, when more than one material is being lithographically patterned, the optical-based pattern alignment methods used in these techniques limit their spatial resolution to approximately 100 nm.

This example describes the generation of multicomponent nanostructures by DPN, and shows that patterns of two different soft materials can be generated by this technique with near-perfect alignment and 10 nm spatial resolution in an arbitrary manner. These results should open many avenues to those interested in molecule-based electronics to generate, align, and interface soft structures with each other and conventional macroscopically addressable microelectronic circuitry.

Unless otherwise specified, DPN was performed on atomically flat Au(111) substrates using a conventional instrument (Park Scientific CP AFM) and cantilevers (Park Scientific Microlever A). The atomically flat Au(111) substrates were prepared by first heating a piece of mica at 120° C. in vacuum for 12 hours to remove possible water and then thermally evaporating 30 nm of gold onto the mica surface at 220° C. in vacuum. Using atomically flat Au(111) substrates, lines 15 nm in width can be deposited. To prevent piezo tube drift problems, a 100 μm scanner with closed loop scan control (Park Scientific) was used for all experiments. The patterning compound was coated on the tips as described in Example 1 (dipping in a solution) or by vapor deposition (for liquids and low-melting-point solids). Vapor deposition was performed by suspending the silicon nitride cantilever in a 100 mL reaction vessel 1 cm above the patterning compound (ODT). The system was closed, heated at 60° C. for 20 min, and then allowed to cool to room temperature prior to use of the coated tips. SEM analysis of tips before and after coating by dipping in a solution or by vapor deposition showed that the patterning compound uniformly coated the tips. The uniform coating on the tips allows one to deposit the patterning compound on a substrate in a controlled fashion, as well as to obtain high quality images.

Figure 9:
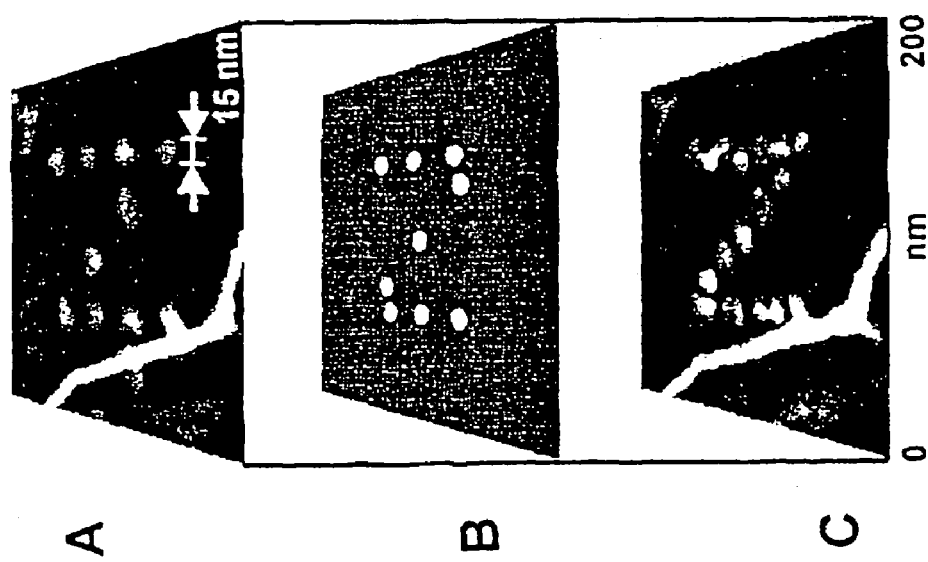
FIGS. 9A-C. Schematic diagrams with lateral force microscopy (LFM) images of nanoscale molecular dots showing the "essential factors" for nanometer scale multiple patterning by DPN. Scale bar is 100 nm.

Since DPN allows one to image nanostructures with the same tool used to form them, there was the tantalizing prospect of generating nanostructures made of different soft materials with excellent registry. The basic idea for generating multiple patterns in registry by DPN is related to analogous strategies for generating multicomponent structures by e-beam lithography that rely on alignment marks. However, the DPN method has two distinct advantages, in that it does not make use of resists or optical methods for locating alignment marks. For example, using DPN, one can generate 15 nm diameter self-assembled monolayer (SAM) dots of 1,16-mercaptohexadecanoic acid (MHA) on a Au(111) faceted substrate (preparation same as described above for atomically flat Au(111) substrates) by holding an MHA-coated tip in contact (0.1 nN) with the Au(111) surface for ten seconds (see FIG. 9A). By increasing the scan size, the patterned dots are then imaged with the same tip by lateral force microscopy (LFM). Since the SAM and bare gold have very different wetting properties, LFM provides excellent contrast. Wilbur et al., *Langmuir* 11, 825 (1995). Based upon the position of the first pattern, the coordinates of additional patterns can be determined (see FIG. 9B), allowing for precise placement of a second pattern of MHA dots. Note the uniformity of the dots (FIG. 9A) and that the maximum misalignment of the first pattern with respect to the second pattern is less than 10 nm (see upper right edge of FIG. 9C). The elapsed time between generating the data in FIGS. 9A and 9C was 10 minutes, demonstrating that DPN, with proper control over environment, can be used to pattern organic monolayers with a spatial and pattern alignment resolution better than 10 nm under ambient conditions.

Figure 10:
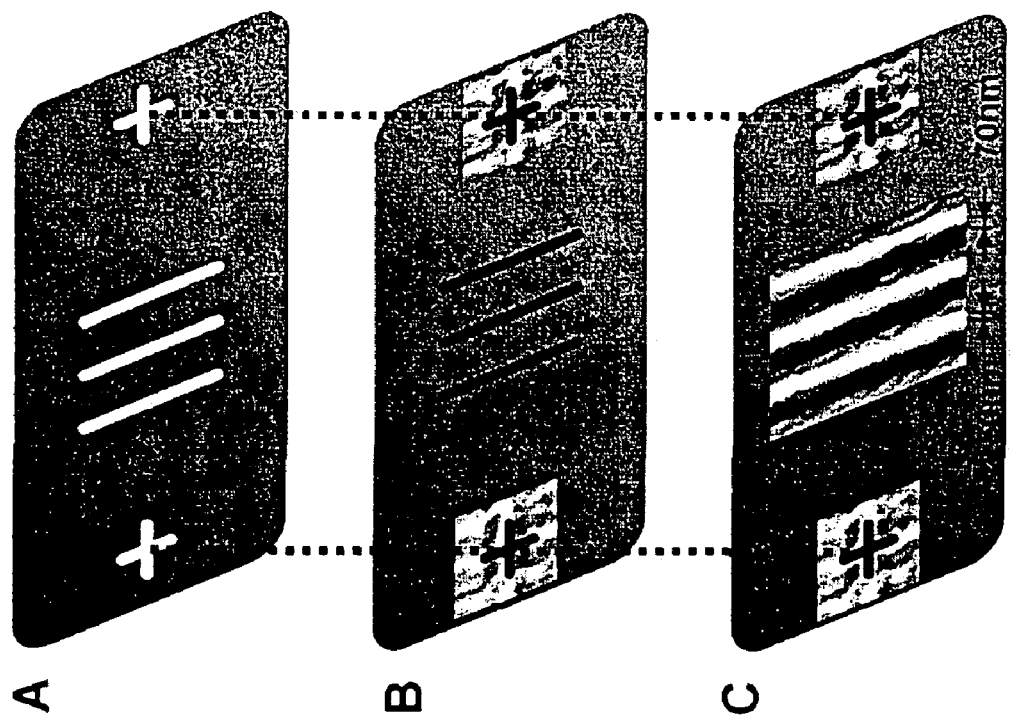
FIGS. 10A-C. For these figures, scale bar is 100 nm.

This method for patterning with multiple patterning compounds required an additional modification of the experiment described above. Since the MHA SAM dot patterns were imaged with an tip coated with a patterning compound, it is likely that a small amount of undetectable patterning compound was deposited while imaging. This could significantly affect some applications of DPN, especially those dealing with electronic measurements on molecule-based structures. To overcome this problem, micron-scale alignment marks drawn with an MHA-coated tip (cross-hairs on FIG. 10A) were used to precisely place nanostructures in a pristine area on the Au substrate. In a typical experiment, an initial pattern of 50 nm parallel lines comprised of MHA and separated by 190 nm was prepared (see FIG. 10A). This pattern was 2 µm away from the exterior alignment marks. Note that an image of these lines was not taken to avoid contamination of the patterned area. The MHA-coated tip was then replaced with an ODT-coated tip. This tip was used to locate the alignment marks, and then precalculated coordinates based upon the position of the alignment marks (FIG. 10B) were used to pattern the substrate with a second set of 50 nm parallel ODT SAM lines (see FIG. 10C). Note that these lines were placed in interdigitated fashion and with near-perfect registry with respect to the first set of MHA SAM lines (see FIG. 10C).

Figure 11A:
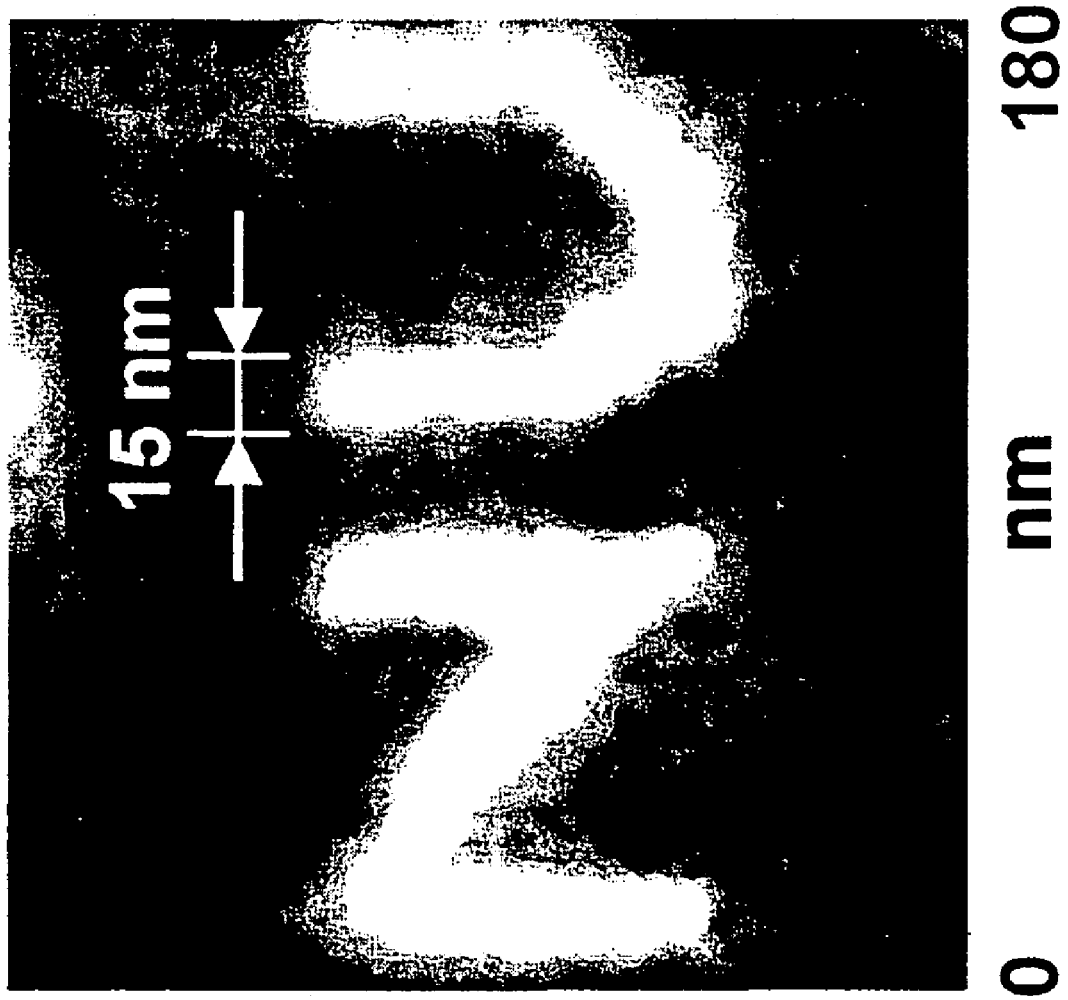
FIG. 11A. Letters drawn by DPN with MHA molecules on amorphous gold surface. Scale bar is 100 nm, and the line width is 15 nm.
Figure 11B:
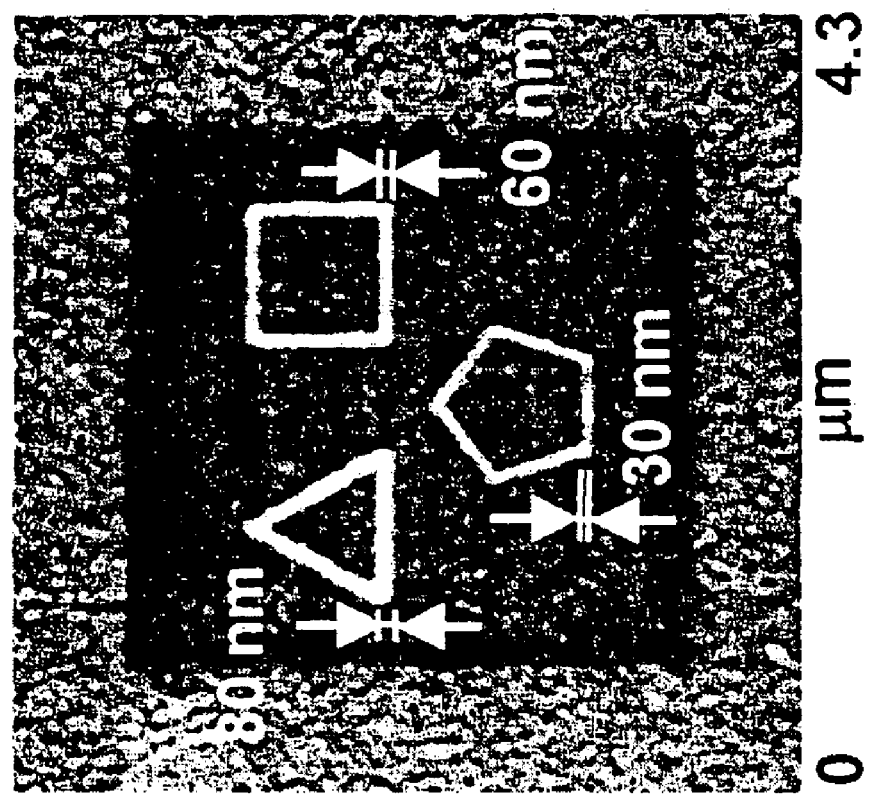
FIG. 11B. Polygons drawn by DPN with MHA molecules on amorphous gold surface. ODT molecules were overwritten around the polygons. Scale bar is 1 μm, and the line width is 100 nm.

There is one unique capability of DPN referred to as "overwriting." Overwriting involves generating one soft structure out of one type of patterning compound and then filling in with a second type of patterning compound by raster scanning across the original nanostructure. As a further proof-of-concept experiment aimed at demonstrating the multiple-patterning-compound, high-registry, and overwriting capabilities of DPN over moderately large areas, a MHA-coated tip was used to generate three geometric structures (a triangle, a square, and a pentagon) with 100 nm line widths. The tip was then changed to an ODT-coated tip, and a 10 µm by 8.5 µm area that comprised the original nanostructures was overwritten with the ODT-coated tip by raster scanning 20 times across the substrate (contact force~0.1 nN) (dark areas of FIG. 11). Since water was used as the transport medium in these experiments, and the water solubilities of the patterning compounds used in these experiments are very low, there was essentially no detectable exchange between the molecules used to generate the nanostructure and the ones used to overwrite on the exposed gold (see FIG. 11).

In summary, the high-resolution, multiple-patterning-compound registration capabilities of DPN have been demonstrated. On an atomically flat Au(111) surface, 15 nm patterns were generated with a spatial resolution better than 10 nm. Even on a rough surface such as amorphous gold, the spatial resolution was better than conventional photolithographic and e-beam lithographic methods for patterning soft materials.

We claim:

1. A nanolithographic method comprising:
providing a substrate;
providing a tip, wherein the tip is coated with a patterning compound; and
contacting the coated tip with the substrate so that the patterning compound is transported by capillary transport and anchored to the substrate so as to produce a pattern.

2. The method according to claim 1, wherein the patterning compound anchors to the substrate and forms a pattern by chemisorption to the substrate.

3. The method according to claim 1, wherein the patterning compound anchors to the substrate and forms a pattern by covalent linkage to the substrate.

4. The method according to claim 1, wherein the tip is an atomic force microscope tip.

5. The method according to claim 1, wherein the tip is a hollow tip.

6. The method according to claim 1, wherein the tip comprises an adhesion layer upon which the patterning compound is coated.

7. The method according to claim 1, wherein the substrate is metal, metal oxide, semiconductor, magnetic, Si, $SiO_2$, or glass.

8. The method according to claim 1, wherein the substrate is metal.

9. The method according to claim 1, wherein the substrate is metal oxide.

10. The method according to claim 1, wherein the substrate is a semiconductor.

11. The method according to claim 1, wherein the substrate is magnetic.

12. The method according to claim 1, wherein the substrate is Si or $SiO_2$.

13. The method according to claim 1, wherein the substrate is glass.

14. The method according to claim 1, wherein the patterning compound is represented by the formula $R_1SH$, $R_1SSR_2$, $R_1SR_2$, $R_1SO_2H$, $(R_1)_3P$, $R_1NC$, or ArSH, wherein $R_1$ and $R_2$ are the same or different, and each has the formula $X(CH_2)_n$; n is 0-30; Ar is an aryl; X is —$CH_3$, —$CHCH_2$, —COOH, —$CO_2(CH_2)_mCH_3$, —OH, —$CH_2OH$, ethylene glycol, hexa(ethylene glycol), —$O(CH_2)_mCH_3$, —$NH_2$, —$NH(CH_2)_mNH_2$, halogen, glucose, maltose, fullerene $C_{60}$, or a nucleic acid; and m is 0-5.

15. The method according to claim 14, wherein the substrate is gold.

16. The method according to claim 1, wherein the patterning compound is represented by the formula $R_1SH$ or ArSH, wherein $R_1$ has the formula $X(CH_2)_n$; n is 0-30; Ar is an aryl; X is —$CH_3$, —CHCH2, —COOH, —$CO_2(CH_2)_mCH_3$, —OH, —$CH_2OH$, ethylene glycol, hexa(ethylene glycol), —$O(CH_2)_mCH_3$, —$NH_2$, —$NH(CH_2)_mNH_2$, halogen, glucose, maltose, fullerene $C_{60}$, or a nucleic acid; and m is 0-5.

17. The method according to claim 16, wherein the substrate is silver, copper, palladium, or semiconductor.

18. The method according to claim 1, wherein the patterning compound is an silane compound.

19. The method according to claim 1, wherein the patterning compound is a carboxylic acid compound.

20. The method according to claim 1, wherein the patterning compound is an amino compound.

21. The method according to claim 1, wherein the patterning compound is a sulfur-containing compound.

22. The method according to claim 1, wherein the patterning compound is a thiol or disulfide compound.

23. The method according to claim 1, wherein the patterning compound is an alcohol.

24. The method according to claim 1, wherein the patterning compound is a nucleic acid compound.

25. The method according to claim 1, wherein the patterning compound is an oligonucleotide.

26. The method according to claim 1, wherein the patterning compound is a DNA compound.

27. The method according to claim 1, wherein the patterning compound is a peptide.

28. The method according to claim 1, wherein the patterning compound is a protein.

29. The method according to claim 1, wherein the patterning compound is coated onto the tip by dipping the tip into a solution of the patterning compound.

30. The method according to claim 29, wherein after dipping the tip is used wet to pattern the substrate.

31. The method according to claim 29, wherein after dipping the tip is dried before used to pattern the substrate.

32. The method according to claim 1, wherein the method is repeated with two or more different patterning compounds being transported to the same substrate.

33. The method according to claim 1, wherein the method is carried out with a plurality of tips with a single nanolithographic device.

34. The method according to claim 1, wherein a registration system is used to align the pattern relative to an alignment mark.

35. The method according to claim 1, wherein the method is carried out to prepare an alignment mark pattern and the method is repeated to prepare a pattern relative to the alignment mark.

36. The method according to claim 1, wherein the nanolithography is carried out in a nanoplotter format.

37. The method according to claim 36, wherein the nanoplotter format is automated using software.

38. The method according to claim 1, wherein the pattern is a dot.

39. The method according to claim 1, wherein the pattern is a line.

40. The method according to claim 1, wherein the substrate smoothness is controlled to improve resolution.

41. The method according to claim 1, wherein the contacting is characterized by a tip-substrate contact time which is controlled to improve resolution.

42. The method according to claim 1, wherein the rate of transport of the patterning compound from the tip to the substrate is controlled to improve resolution.

43. The method according to claim 1, wherein the relative humidity is controlled during transport to improve resolution.

44. The method according to claim 1, wherein the transport is carried out in an isolation chamber.

45. The method according to claim 44, wherein the isolation chamber provides for measurement and control of relative humidity.

46. The method according to claim 1, wherein tip sharpness is controlled to improve resolution.

47. The method according to claim 1, wherein the nanolithographic method is used to functionalize microscale or nanoscale structures.

48. The method according to claim 1, wherein the nanolithographic method is used to fabricate a microsensor, a microreactor, a combinatorial array, a micromechanical system, a microanalytical system, a biosurface, a biomaterial, a microelectronics system, a microoptical system, or a nanoelectronic device.

49. The method according to claim 1, wherein the nanolithographic method is used to functionalize a nanoscale device.

50. The method according to claim 1, wherein the pattern is a self-assembled monolayer.

51. The method according to claim 1, wherein the pattern has a lattice parameter.

52. The method according to claim 1, wherein the pattern is a line with a line width of about 15 nm to about 250 nm.

53. The method according to claim 1, wherein the pattern is a line with a line width of about 30 nm to about 100 nm.

54. The method according to claim 1, wherein the pattern is a dot having width of about 12 nm to about 5 microns.

55. The method according to claim 1, wherein the pattern is a dot having width of about 460 nm to about 1.6 microns.

56. The method according to claim 1, wherein the pattern is an array.

57. The method according to claim 1, wherein the pattern is an array or grid of dots or lines.

58. The method according to claim 1, wherein the pattern has a pattern resolution which is about 10 nm or more.

59. The method according to claim 1, wherein the pattern has a pattern resolution of about 10 nm or less.

60. The method according to claim 1, wherein the method is carried out to prepare a first pattern of a first material, and carried out to prepare a second pattern of a second material, wherein the first and second patterns are aligned with each other.

61. The method according to claim 60, wherein the alignment is characterized by a spatial resolution of at least 10 nm.

62. The method according to claim 1, wherein the method is used for overwriting.

63. The method according to claim 1, wherein the patterning compound anchors to the substrate and forms a pattern by chemisorption to the substrate and the tip is an atomic force microscopic tip.

64. The method according to claim 63, wherein the patterning compound is a peptide or protein.

65. The method according to claim 63, wherein the patterning compound is a nucleic acid compound.

66. The method according to claim 63, wherein the method is carried out with a plurality of tips with a single nanolithographic device.

67. The method according to claim 63, wherein a registration system is used to align the pattern relative to an alignment mark.

68. The method according to claim 63, wherein the relative humidity is controlled during transport to improve resolution.

69. The method according to claim 68, wherein the patterning compound is a peptide or protein.

70. The method according to claim 68, wherein the patterning compound is a nucleic acid.

71. The method according to claim 68, wherein the method is carried out with a plurality of tips with a single nanolithographic device.

72. The method according to claim 68, wherein a registration system is used to align the pattern relative to an alignment mark.

73. The method according to claim 68, wherein the pattern is a line with a line width of about 15 nm to about 250 nm.

74. The method according to claim 68, wherein the pattern is a dot having width of about 12 nm to about 5 microns.

75. The method according to claim 68, wherein the method is carried out to prepare a first pattern of a first material, and carried out to prepare a second pattern of a second material, wherein the first and second patterns are aligned with each other.

76. The method according to claim 63, wherein the pattern is a line with a line width of about 15 nm to about 250 nm.

77. The method according to claim 63, wherein the pattern is a dot having width of about 12 nm to about 5 microns.

78. The method according to claim 63, wherein the pattern is a nanoarray of dots.

79. The method according to claim 63, wherein the method is carried out to prepare a first pattern of a first material, and carried out to prepare a second pattern of a second material, wherein the first and second patterns are aligned with each other.

80. The method according to claim 1, wherein a registration system is used to align the pattern relative to an alignment mark.

81. The method according to claim 1, wherein the patterning compound is an antibody.

82. The method according to claim 1, wherein the patterning compound is an enzyme.

83. The method according to claim 1, wherein the patterning compound is an RNA.

84. The method according to claim 1, wherein the patterning compound is a ligand.

85. The method according to claim 1, wherein the patterning compound is an antigen.

86. The method according to claim 1, wherein the patterning compound is an enzyme substrate.

87. The method according to claim 1, wherein the patterning compound is a receptor.

88. The method according to claim 1, wherein the tip is a hollow tip serving as a reservoir for a patterning compound.

89. The method according to claim 1, wherein the tip is a hollow tip serving as a reservoir for a protein patterning compound.

90. The method according to claim 1, wherein the tip is a hollow tip serving as a reservoir for an antibody patterning compound.

91. A direct-write nanolithographic method comprising:
providing a substrate;
providing a scanning probe microscope tip comprising a patterning ink on the tip surface; and
transporting the patterning ink from the tip to the substrate by capillary transport so as to produce a nanolithographic pattern.

92. The method according to claim 91, wherein the patterning ink is selected for chemisorption to the substrate.

93. The method according to claim 91, wherein the patterning ink is selected for covalent linkage to the substrate.

94. The method according to claim 91, wherein the tip is an atomic force microscope tip.

95. The method according to claim 91, wherein the tip is a hollow tip.

96. The method according to claim 91, wherein the tip comprises an adhesion layer upon which the patterning ink is coated.

97. The method according to claim 91, wherein the substrate is metal, metal oxide, semiconductor, magnetic, Si, $SiO_2$, or glass.

98. The method according to claim 91, wherein the substrate is metal.

99. The method according to claim 91, wherein the substrate is metal oxide.

100. The method according to claim 91, wherein the substrate is a semiconductor.

101. The method according to claim 91, wherein the substrate is magnetic.

102. The method according to claim 91, wherein the substrate is Si or $SiO_2$.

103. The method according to claim 91, wherein the substrate is glass.

104. The method according to claim 91, wherein the patterning comprises a compound represented by the formula $R_1SH$, $R_1SSR_2$, $R_1SR_2$, $R_1SO_2H$, $(R_1)_3P$, $R_1NC$, or ArSH, wherein $R_1$ and $R_2$ are the same or different, and each has the formula $X(CH_2)_n$; n is 0-30; Ar is an aryl; X is —$CH_3$, —$CHCH_2$, —COOH, —$CO_2(CH_2)_mCH_3$, —OH, —$CH_2OH$, ethylene glycol, hexa(ethylene glycol), —$O(CH_2)_mCH_3$, —$NH_2$, —$NH(CH_2)_mNH_2$, halogen, glucose, maltose, fullerene $C_{60}$, or a nucleic acid; and m is 0-5.

105. The method according to claim 104, wherein the substrate is gold.

106. The method according to claim 91, wherein the patterning ink comprises a compound represented by the formula $R_1SH$ or ArSH, wherein $R_1$ has the formula $X(CH_2)_n$; n is 0-30; Ar is an aryl; X is —$CH_3$, —$CHCH_2$, COOH, —$CO_2(CH_2)_mCH_3$, —OH, —$CH_2OH$, ethylene glycol, hexa(ethylene glycol), —$O(CH_2)_mCH_3$, —$NH_2$, —$NH(CH_2)_mNH_2$, halogen, glucose, maltose, fullerene $C_{60}$, or a nucleic acid; and m is 0-5.

107. The method according to claim 106, wherein the substrate is silver, copper, palladium, or semiconductor.

108. The method according to claim 91, wherein the patterning ink comprises a silane compound.

109. The method according to claim 91, wherein the patterning ink comprises a carboxylic acid.

110. The method according to claim 91, wherein the patterning ink comprises an amino compound.

111. The method according to claim 91, wherein the patterning ink comprises a sulfur-containing compound.

112. The method according to claim 91, wherein the patterning ink comprises a thiol or disulfide compound.

113. The method according to claim 91, wherein the patterning ink comprises an alcohol.

114. The method according to claim 91, wherein the patterning ink comprises a nucleic acid compound.

115. The method according to claim 91, wherein the patterning ink comprises an oligonucleotide.

116. The method according to claim 91, wherein the patterning ink comprises a DNA compound.

117. The method according to claim 91, wherein the patterning ink comprises a peptide.

118. The method according to claim 91, wherein the patterning ink comprises a protein.

119. The method according to claim 91, wherein the patterning ink is coated onto the tip by dipping the tip into a solution of a patterning compound.

120. The method according to claim 91, wherein after dipping the tip is used wet to pattern the substrate.

121. The method according to claim 91, wherein after dipping the tip is dried before used to pattern the substrate.

122. The method according to claim 91, wherein the method is repeated with two or more different patterning inks being transported to the same substrate.

123. The method according to claim 91, wherein the method is carried out with a plurality of tips with a single nanolithographic device.

124. The method according to claim 91, wherein the method is carried out to prepare an alignment mark pattern and the method is repeated to prepare a pattern relative to the alignment mark.

125. The method according to claim 91, wherein the nanolithography is carried out in a nanoplotter format.

126. The method according to claim 125, wherein the nanoplotter format is automated using software.

127. The method according to claim 91, wherein the pattern is a dot.

128. The method according to claim 91, wherein the pattern is a line.

129. The method according to claim 91, wherein the substrate smoothness is controlled.

130. The method according to claim 91, wherein the contacting is characterized by a tip-substrate contact time which is controlled.

131. The method according to claim 91, wherein the rate of transport of the patterning ink from the tip to the substrate is controlled.

132. The method according to claim 91, wherein the relative humidity is controlled.

133. The method according to claim 91, wherein the transport is carried out in an isolation chamber.

134. The method according to claim 133, wherein the isolation chamber provides for control of relative humidity.

135. The method according to claim 91, wherein tip sharpness is controlled.

136. The method according to claim 91, wherein the nanolithographic method is used to functionalize microscale or nanoscale structures.

137. The method according to claim 91, wherein the nanolithographic method is used to fabricate a microsensor, a microreactor, a combinatorial array, a micromechanical system, a microanalytical system, a biosurface, a biomaterial, a microelectronics system, a microoptical system, or a nanoelectronic device.

138. The method according to claim 91, wherein the nanolithographic method is used to functionalize a nanoscale device.

139. The method according to claim 91, wherein the pattern is a self-assembled monolayer.

140. The method according to claim 91, wherein the pattern has a lattice parameter.

141. The method according to claim 91, wherein the pattern is a line with a line width of about 15 nm to about 250 nm.

142. The method according to claim 91, wherein the pattern is a line with a line width of about 30 nm to about 100 nm.

143. The method according to claim 91, wherein the pattern is a dot having width of about 12 nm to about 5 microns.

144. The method according to claim 91, wherein the pattern is a dot having width of about 460 nm to about 1.6 microns.

145. The method according to claim 91, wherein the pattern is an array.

146. The method according to claim 91, wherein the pattern is an array or grid of dots or lines.

147. The method according to claim 91, wherein the pattern has a pattern resolution which is about 10 nm or more.

148. The method according to claim 91, wherein the pattern has a pattern resolution of about 10 nm or less.

149. The method according to claim 91, wherein the method is carried out to prepare a first pattern of a first material, and carried out to prepare a second pattern of a second material, wherein the first and second patterns are aligned with each other.

150. The method according to claim 91, wherein the alignment is characterized by a spatial resolution of at least 10 nm.

151. The method according to claim 91, wherein the method is used for overwriting.

152. The method according to claim 91, wherein the patterning ink anchors to the substrate and forms a nanolithographic pattern by chemisorption to the substrate and the tip is an atomic force microscopic tip.

153. The method according to claim 152, wherein the patterning ink comprises a peptide or protein.

154. The method according to claim 152, wherein the patterning ink comprises a nucleic acid compound.

155. The method according to claim 152, wherein the method is carried out with a plurality of tips with a single nanolithographic device.

156. The method according to claim 152, wherein a registration system is used to align the pattern relative to an alignment mark.

157. The method according to claim 152, wherein the relative humidity is controlled during transport.

158. The method according to claim 157, wherein the patterning ink comprises a peptide or protein.

159. The method according to claim 157, wherein the patterning ink comprises a nucleic acid.

160. The method according to claim 157, wherein the method is carried out with a plurality of tips with a single nanolithographic device.

161. The method according to claim 157, wherein a registration system is used to align the pattern relative to an alignment mark.

162. The method according to claim 157, wherein the method is carried out to prepare a first pattern of a first material, and carried out to prepare a second pattern of a second material, wherein the first and second patterns are aligned with each other.

163. The method according to claim 152, wherein the pattern is a line with a line width of about 15 nm to about 250 nm.

164. The method according to claim 152, wherein the pattern is a dot having width of about 12 nm to about 5 microns.

165. The method according to claim 152, wherein the method is carried out to prepare a first pattern of a first material, and carried out to prepare a second pattern of a second material, wherein the first and second patterns are aligned with each other.

166. The method according to claim 91, wherein the pattern is a nanoarray.

167. The method according to claim 91, wherein the pattern is a nanoarray of dots.

168. The method according to claim 91, wherein the tip is modified for adhesion of the patterning ink.

169. The method according to claim 91, wherein the substrate and patterning ink are selected for chemisorption or covalent bonding to each other upon transport of ink to substrate.

170. A direct-write nanolithographic method consisting essentially of depositing a plurality of patterns on a substrate by capillary transport of an ink from a tip to a solid substrate with sub-micron resolution.

171. The method according to claim 170, wherein the tip is an atomic force microscopic tip.

172. The method according to claim 170, wherein the tip is a hollow tip.

173. The method according to claim 170, wherein the resolution is 100 nm or less.

174. The method according to claim 170, wherein the resolution is 10 nm or better.

175. The method according to claim 174, wherein exterior alignment marks are used.

176. A method of nanolithography comprising:
providing a substrate;
providing a tip with a patterning compound thereon;
contacting the coated tip with the substrate so that the compound is applied to the substrate by capillary transport so as to produce a first desired pattern; and
contacting the coated tip with the substrate so that a compound is applied to the substrate by capillary transport so as to produce a second desired pattern;
wherein the spatial resolution between the first and second patterns is 10 nm or better.

177. The method according to claim 176, wherein the tip is a scanning probe microscopic tip.

178. The method according to claim 176, wherein the tip is a hollow tip.

179. The method according to claim 176, wherein the contacting is carried out in an isolation chamber.

180. The method according to claim 176, wherein the first and second patterns are chemisorbed or covalently bonded to the substrate.

* * * * *

UNITED STATES PATENT AND TRADEMARK OFFICE
CERTIFICATE OF CORRECTION

PATENT NO. : 7,569,252 B2  
APPLICATION NO. : 10/449685  
DATED : August 4, 2009  
INVENTOR(S) : Chad A. Mirkin et al.

Page 1 of 1

It is certified that error appears in the above-identified patent and that said Letters Patent is hereby corrected as shown below:

Column 1, line 11 please delete the following, "This invention was made with government support under grant F49620-96-1-055 from the Air Force Office Of Science Research", and insert therefore:

--This invention was made with government support under grant F49620-96-1-0155 from the Air Force Office Of Science Research--.

Signed and Sealed this

Tenth Day of November, 2009

David J. Kappos
*Director of the United States Patent and Trademark Office*

UNITED STATES PATENT AND TRADEMARK OFFICE
CERTIFICATE OF CORRECTION

PATENT NO. : 7,569,252 B2 Page 1 of 1
APPLICATION NO. : 10/449685
DATED : August 4, 2009
INVENTOR(S) : Chad A. Mirkin It is certified that error appears in the above-identified patent and that said Letters Patent is hereby corrected as shown below:

On the Title Page

Item [*] Notice: Subject to any disclaimer, the term of this patent is extended or adjusted under 35 USC 154(b) by (663) days Delete the phrase "by 663 days" and insert -- by 1332 days --

Signed and Sealed this

Twentieth Day of April, 2010

David J. Kappos
*Director of the United States Patent and Trademark Office*